United States Patent
Ouchi et al.

(10) Patent No.: US 8,177,561 B2
(45) Date of Patent: May 15, 2012

(54) SOCKET CONTACT TERMINAL AND SEMICONDUCTOR DEVICE

(75) Inventors: Yasuhiro Ouchi, Sakura (JP); Shinichi Nikaido, Sakura (JP); Haruo Miyazawa, Sakura (JP); Hirohito Watanabe, Sakura (JP); Katsuya Yamagami, Sakura (JP)

(73) Assignee: Fujikura Ltd., Tokyo (JP)

( * ) Notice: Subject to any disclaimer, the term of this patent is extended or adjusted under 35 U.S.C. 154(b) by 715 days.

(21) Appl. No.: 12/302,867
(22) PCT Filed: May 23, 2007
(86) PCT No.: PCT/JP2007/060513
§ 371 (c)(1),
(2), (4) Date: Nov. 28, 2008

(87) PCT Pub. No.: WO2007/138952
PCT Pub. Date: Dec. 6, 2007

(65) Prior Publication Data
US 2009/0250256 A1 Oct. 8, 2009

(30) Foreign Application Priority Data

| May 30, 2006 | (JP) | 2006-149510 |
| Jun. 2, 2006 | (JP) | 2006-154545 |
| Jun. 7, 2006 | (JP) | 2006-158670 |
| Jun. 12, 2006 | (JP) | 2006-162508 |
| Jun. 12, 2006 | (JP) | 2006-162509 |

(51) Int. Cl.
*H05K 1/00* (2006.01)
(52) U.S. Cl. .......... 439/66; 174/260; 174/261; 174/262; 174/263; 439/68; 439/625; 439/71; 439/331; 439/733.1; 439/751; 29/747
(58) Field of Classification Search .......... 174/260–263; 439/68, 625, 66, 71, 331, 733.1, 751; 29/747
See application file for complete search history.

(56) References Cited

U.S. PATENT DOCUMENTS

| 3,924,915 A * | 12/1975 | Conrad ............... 439/66 |
| 4,548,451 A | 10/1985 | Benarr et al. |
| 4,655,519 A | 4/1987 | Evans et al. |
| 5,395,252 A * | 3/1995 | White ............... 439/66 |
| 5,427,535 A * | 6/1995 | Sinclair ............... 439/66 |
| 5,433,632 A * | 7/1995 | Cherney et al. ............... 439/495 |
| 5,516,988 A * | 5/1996 | Yamauchi ............... 174/250 |
| 5,893,761 A * | 4/1999 | Longueville ............... 439/66 |
| 5,997,315 A * | 12/1999 | Akama et al. ............... 439/66 |
| 6,176,707 B1 * | 1/2001 | Neidich et al. ............... 439/66 |
| 6,217,342 B1 * | 4/2001 | Neidich et al. ............... 439/66 |
| 6,241,533 B1 * | 6/2001 | Matsumoto ............... 439/67 |
| 6,273,731 B1 * | 8/2001 | Bishop et al. ............... 439/66 |
| 6,290,507 B1 * | 9/2001 | Neidich et al. ............... 439/66 |
| 6,315,576 B1 * | 11/2001 | Neidich ............... 439/66 |
| 6,669,490 B1 | 12/2003 | DelPrete et al. |
| 6,851,986 B2 * | 2/2005 | Zhao ............... 439/744 |
| 6,939,142 B2 * | 9/2005 | Maruyama et al. ............... 439/66 |
| 6,976,888 B2 | 12/2005 | Shirai et al. |
| 7,021,972 B2 * | 4/2006 | Richter et al. ............... 439/700 |
| 7,083,429 B2 | 8/2006 | Hashimoto et al. |
| 7,126,062 B1 * | 10/2006 | Vinther et al. ............... 174/260 |
| 7,134,880 B2 * | 11/2006 | Arai et al. ............... 439/66 |
| 7,445,518 B2 * | 11/2008 | Schneider nee Hild et al. ............... 439/700 |
| 7,625,216 B2 * | 12/2009 | Mendenhall et al. ............... 439/66 |
| 2002/0045366 A1 * | 4/2002 | Ohtsuki et al. ............... 439/66 |
| 2004/0253844 A1 * | 12/2004 | Mendenhall et al. ............... 439/66 |
| 2005/0286239 A1 * | 12/2005 | Trobough ............... 361/785 |

FOREIGN PATENT DOCUMENTS

JP 53-146975 11/1978
(Continued)

*Primary Examiner* — Hung S Bui
*Assistant Examiner* — James Wu
(74) *Attorney, Agent, or Firm* — Sughrue Mion, PLLC

(57) ABSTRACT

A socket contact terminal for electrical connection between a connection portion formed of a metal conductor on a printed circuit board and a connection terminal of an IC package. The contact terminal comprises a metal terminal composed of a main columnar portion and arm portions on both sides and having an angular U shape and an elastomeric member attached to the metal terminal. A metal surface is exposed from the outer surface of each arm portion. The elastomeric member is firmly held between the arm portions of the metal terminal and exhibits a repulsive force when the arm portions are pressed in the direction that the arm portions approach each other.

51 Claims, 23 Drawing Sheets

FOREIGN PATENT DOCUMENTS

| | | |
|---|---|---|
| JP | 58-69976 U | 5/1983 |
| JP | 60-230377 A | 11/1985 |
| JP | 3-50844 A | 3/1991 |
| JP | 4-133365 U | 12/1992 |
| JP | 8-88062 A | 4/1996 |
| JP | 9-82431 A | 3/1997 |
| JP | 9-266038 A | 10/1997 |
| JP | 09266038 A * | 10/1997 |
| JP | 10223338 A | 8/1998 |
| JP | 11-102760 A | 4/1999 |
| JP | 2001-266983 A | 9/2001 |
| JP | 20028810 A | 11/2002 |
| JP | 2003-77562 A | 3/2003 |
| JP | 2003-151709 A | 5/2003 |
| JP | 2003-217707 A | 7/2003 |
| JP | 2003185700 A | 7/2003 |
| JP | 2004-158430 A | 6/2004 |
| JP | 2005-19284 A | 1/2005 |
| JP | 2005-228504 A | 8/2005 |
| JP | 2005-251420 A | 9/2005 |
| JP | 2006-073472 A | 3/2006 |
| JP | 2007-149569 A | 6/2007 |
| TW | M273108 | 8/2005 |

* cited by examiner

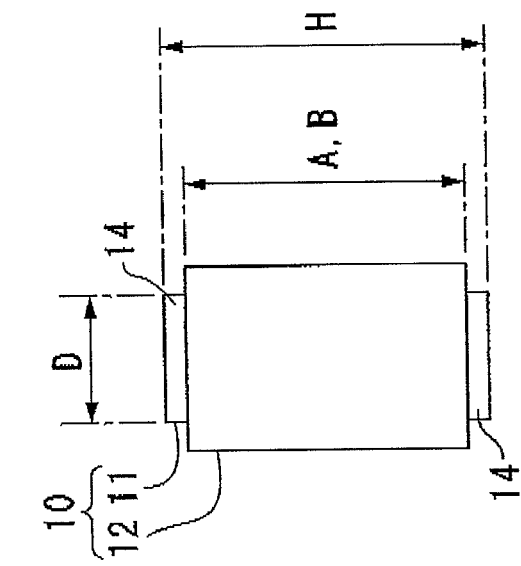
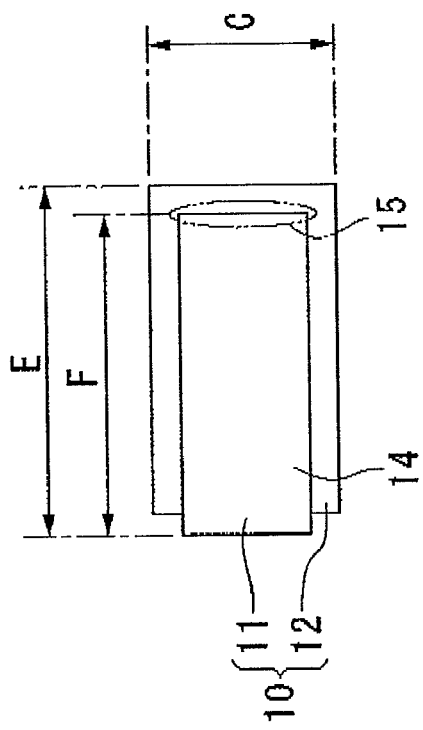
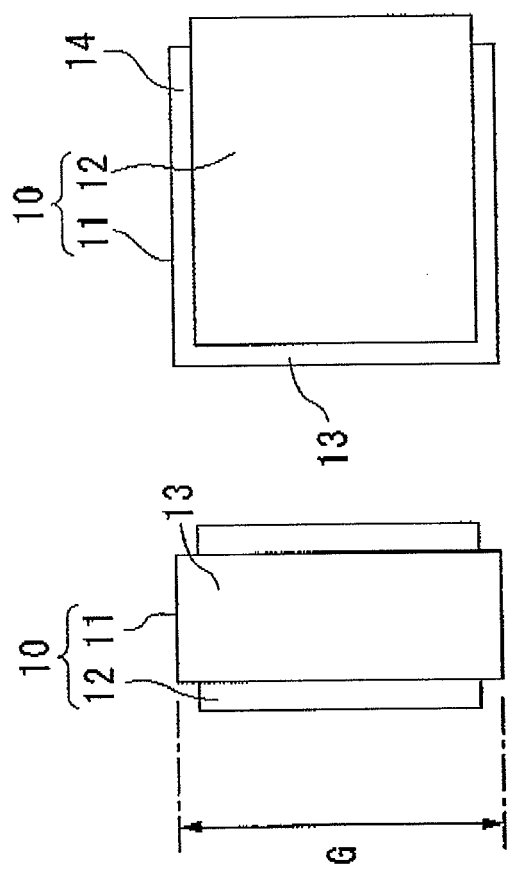

ELASTOMER PROCESSING

UPWARDLY PRESS TONGUE PIECE PORTION

INSERT METAL TERMINAL

RELEASE UPWARDLY PRESSED STATE OF TONGUE PIECE PORTION

INSERTION COMPLETED

SOCKET CONTACT TERMINAL AND SEMICONDUCTOR DEVICE

TECHNICAL FIELD

The present invention relates to an IC socket contact terminal used for mounting an IC package such as a CPU or an LSI on a printed circuit board. More particularly, the present invention relates to a socket contact terminal which can be suitably used for mounting an IC package such as an LGA package or a BGA package on a printed circuit board, and to a semiconductor device using the same.

This application is based upon and claims the benefit of priority from prior Japanese Patent Application Nos. 2006-149510 filed at the Japan Patent Office on May 30, 2006, 2006-154545 filed at the Japan Patent Office on Jun. 2, 2006, 2006-158670 filed at the Japan Patent Office on Jun. 7, 2006, 2006-162508 filed at the Japan Patent Office on Jun. 12, 2006, and 2006-162509 filed at the Japan Patent Office on Jun. 12, 2006, the contents of which are hereby incorporated by reference in their entirety.

BACKGROUND ART

Hitherto, there has been studied a technique for mounting an IC package such as a CPU or an LSI on a printed circuit board through the intervention of a socket. In most motherboards of a variety of semiconductor devices, e.g., a personal computer and a server, a socket is mounted therein for attachment of a CPU implemented in an LGA or BOA package thereto.

The CPU has been made to have more pins and a faster operation speed every year in order to improve its function and performance. To cope with such requirements, the CPU package has been made to have a larger size while having a finer pin pitch.

Accompanied with this, the socket is required to cope with the ever-increasing number of pins while coping with problems such as an increase in the amount of bending thereof in response to the increase in the package size or a difference in height of contact lands or balls of the package. Hence, it is desired to provide a structure capable of securing a sufficient stroke of a socket contact.

Moreover, as a countermeasure to the fine pitch requirements, it is important to decrease the size of the socket contact, and it is desirable to be able to provide secure contact between IC pins and socket contacts under suitable contact pressure.

Furthermore, as a countermeasure to the fast operation speed requirements, it is important for a contact terminal to have a low inductance, and it is desired for the contact terminal to have a low contact resistance and a high allowable current to cope with an increase in the consumption current in response to the faster operation speed.

Current LGA package sockets mainly have 400 to 800 pins having a pitch of about 1 mm and are fabricated using a method of complicatedly folding a metal plate to form contact terminals having a predetermined shape and inserting the contact terminals in a socket housing. Such a conventional technique is disclosed in Patent Documents 1 and 2, for example.

Patent Document 1: Japanese Patent Application Laid-Open No. 2004-158430

Patent Document 2: Japanese Patent Application Laid-Open No. 2005-019284

Patent Document 3: U.S. Pat. No. 6,669,490

However, in the conventional technique disclosed in Patent Documents 1 and 2, the contact terminal is of a plate spring type, and thus, when the spring length is increased to increase the stroke of the contact terminal, the contact terminal may make contact with adjacent pins. Therefore, there is a problem that it is difficult to increase the stroke when the pins are made to have a finer pitch.

Moreover, in order to resolve such a problem, Patent Document 3 has proposed a technique that uses a structure using a column formed of a conductive elastomeric member in the contact terminal. In this case, since the repulsive properties of a socket are determined by the characteristics or the structure of the conductive elastomeric member, as long as it is possible to find a conductive elastomeric member exhibiting a suitable repulsive force, it is possible to realize a socket capable of securing a sufficient stroke under a desired load.

However, when the conductive elastomeric member as disclosed in Patent Document 3 is used, since the contact terminal is not a metal but an elastomeric member, the contact resistance is high compared with a metallic contact and there is a fear of an increasing possibility of heat generation or voltage drop in response to higher current consumption. Moreover, since the contact terminal does not wipe a metallic land when it is inserted to be fitted in a package, there occurs a new problem that it is difficult to remove an oxide film formed on a land.

DISCLOSURE OF THE INVENTION

The present invention has been made in view of the above-described circumstances and an object of the present invention is to provide an excellent socket contact terminal capable of coping with low resistance, large current and fast operation speed requirements and a semiconductor device using the same.

In order to attain the object, according to a first aspect of the invention, there is disclosed a socket contact terminal for electrical connection between a connection portion formed of a metal conductor on a printed circuit board and a connection terminal of an IC package, the socket contact comprising: a metal terminal having an angular U shape including a main columnar portion and arm portions on both sides thereof; and an elastomeric member attached to the metal terminal, wherein a metal surface is exposed from an outer surface of each of the arm portions of the metal terminal, and wherein the elastomeric member is firmly held between the arm portions of the metal terminal so as to exhibit a repulsive force when the arm portions are pressed in the direction that the arm portions approach each other.

In the socket contact terminal according to the above aspect of the invention, it is preferable that the IC package is an LGA package or a BGA package.

In the socket contact terminal according to the above aspect of the invention, it is preferable that a convex portion is provided on an outer surface side of each of the arm portions of the metal terminal.

In the socket contact terminal according to the above aspect of the invention, it is preferable that the metal terminal is obtained by applying gold plating to a surface of a substrate formed of copper or copper alloy.

In the socket contact terminal according to the above aspect of the invention, it is preferable that at least a portion of the main columnar portion of the metal terminal is formed to have a larger width than other portions.

In the socket contact terminal according to the above aspect of the invention, it is preferable that at least a portion of the main columnar portion of the metal terminal is formed to have a larger thickness than other portions.

In the socket contact terminal according to the above aspect of the invention, it is preferable that the convex portion has a dome shape.

In the socket contact terminal according to the above aspect of the invention, it is preferable that the convex portion has a semi-cylindrical shape.

In the socket contact terminal according to the above aspect of the invention, it is preferable that at least a portion of the main columnar portion of the metal terminal is folded back on itself to have a larger thickness than other portions.

In the socket contact terminal according to the above aspect of the invention, it is preferable that the elastomeric member is a fluorine rubber.

The present invention also provides a semiconductor device comprising the socket contact terminal according to the above aspect of the invention, a printed circuit board, and an IC package, the printed circuit board and the IC package being electrically connected with each other through the intervention of the socket contact terminal.

[Advantage of First Aspect of the Invention]

The socket contact terminal according to this aspect of the invention includes a metal terminal having an angular U shape and an elastomeric member attached to the metal terminal and has a configuration in which a metal surface is exposed from an outer surface of each of the arm portions of the metal terminal, and in which the elastomeric member is firmly held between the arm portions of the metal terminal so as to exhibit a repulsive force when the arm portions are pressed in the direction that the arm portions approach each other. Owing to such a configuration, by adjusting a dimension of the elastomeric member, it is possible to easily design the socket contact terminal to provide necessary load-displacement characteristics.

Moreover, since the metal surface is exposed from the outer surface of each of the arm portions of the metal terminal, it is possible to connect either one of the outer surfaces of the arm portions to the connection portion and the connection terminal by means of a metal junction. Therefore, it is possible to realize a low contact resistance connection between the printed circuit board and the IC package.

Furthermore, since a current flows through the metal terminal having an angular U shape, it is possible to realize a low inductance connection.

Furthermore, the metal terminal has a configuration in which the arm portions are sunken into the elastomeric member about the main columnar portion having an angular U shape. Therefore, when a load is applied to the metal terminal, it is possible to realize a wiping function in which the metal terminal makes contact with opposing contact surfaces with a position thereof shifted while sliding on the opposing contact surfaces. Accordingly, it is possible to remove an oxide film or foreign materials on a surface of the metal terminal, so that connection can be realized with fresh metal surfaces.

Furthermore, since vertical contact can be carried out by means of a load-induced connection, it is possible to design a replaceable socket and to provide excellent maintenance properties as required for use in a server.

Furthermore, since a convex portion is provided on an outer surface of each of the arm portions of the metal terminal, it is possible to provide load-displacement characteristics necessary for a flat electrode as used in a printed circuit board or an LGA package.

Furthermore, since the metal terminal is obtained by applying gold plating to a surface of a substrate formed of copper or copper alloy, it is possible to provide an excellent connection structure having both easy processability with a connection portion formed of gold and good electrical contact reliability with a gold land.

Furthermore, since at least a portion of the main columnar portion of the metal terminal is formed to have a larger width than other portions, it is possible to decrease electrical resistance. Moreover, by using the main columnar portion as a beam when the socket contact terminal is fixed to a housing, it is possible to facilitate the assembly of a semiconductor device and to increase mechanical strength of a fixing portion.

Furthermore, since at least a portion of the main columnar portion of the metal terminal is formed to have a larger thickness than other portions, it is possible to decrease electrical resistance. Moreover, when the arm portions are pressed, since a portion of the elastomeric member escapes into a gap between the elastomeric member and a portion of the main columnar portion other than the thick plate portion, it is possible to make the elastomeric member difficult to be removed from the metal terminal.

Furthermore, since the convex portion provided on the outer surface of each of the arm portions is formed to have a dome shape, it is possible to increase the strength against a load.

Furthermore, since the convex portion provided on the outer surface of each of the arm portions is formed to have a semi-cylindrical shape, it is possible to form the convex portion by merely folding the arm portions of the metal terminal. Therefore, it is possible to facilitate the fabrication of the metal terminal, and the metal terminal can be fabricated at a low cost.

Furthermore, since at least a portion of the main columnar portion of the metal terminal is folded back on itself to have a larger thickness than other portions, it is possible to decrease electrical resistance. Moreover, when the arm portions are pressed, since a portion of the elastomeric member escapes into a gap between the elastomeric member and a portion of the main columnar portion other than the thick plate portion, it is possible to make the elastomeric member difficult to be removed from the metal terminal.

Furthermore, since the elastomeric member is formed of a fluorine rubber, it is possible to provide high heat-resisting properties, and thus, a solder reflow process can be performed when bonding the socket contact terminal to a substrate or a package. Therefore, it is possible to facilitate a bonding process and to thus decrease production costs.

Furthermore, since the semiconductor device according to this aspect of the invention includes the socket contact terminal according to the above aspect of the invention, a printed circuit board, and an IC package, the printed circuit board and the IC package being electrically connected with each other through the intervention of the socket contact terminal, it is possible to provide a high-performance device or apparatus capable of coping with low resistance, large current and fast operation speed requirements.

According to a second aspect of the invention, there is provided a socket, comprising: an elastomer having a groove or a through-hole formed in a peripheral portion of a metal terminal arrangement region and a terminal attachment through-hole formed in a portion of a peripheral border of the metal terminal arrangement region; and a metal terminal having an angular U shape including a main columnar portion being in contact with an inner surface of the terminal attachment through-hole and arm portions configured to extend from both ends of the main columnar portion along both front and back surfaces of the elastomer to the metal terminal arrangement region.

In the socket according to the above aspect of the invention, it is preferable that the elastomer is a fluorinated elastomer.

In the socket according to the above aspect of the invention, it is preferable that the elastomer has a groove formed in a peripheral portion of the metal terminal arrangement region on either the front or back surface thereof, the groove having a depth that does not penetrate through the elastomer.

In the socket according to the above aspect of the invention, it is preferable that the elastomer has a through-hole formed in a peripheral portion of the metal terminal arrangement region so as to penetrate through the front and back surfaces thereof.

In the socket according to the above aspect of the invention, it is preferable that a convex portion is provided on an outer surface of each of the arm portions of the metal terminal.

In the socket according to the above aspect of the invention, it is preferable that a plurality of the metal terminals is provided in a plate-like elastomer.

The second aspect of the invention also provides a method of fabricating the socket according to the above aspect of the invention, the method comprising the steps of: boring a terminal attachment through-hole in a portion of a peripheral border of a metal terminal forming position; preparing an elastomer having a groove or a through-hole formed in a peripheral portion of the metal terminal forming position and a metal terminal having an angular U shape; passing a portion of the metal terminal into the terminal attachment through-hole of the elastomer; and making the elastomer at the metal terminal forming position to be firmly held between arm portions on both sides of the metal terminal, thereby obtaining the socket according to the present invention.

The second aspect of the invention also provides a method of fabricating the socket according to the above aspect of the invention, the method comprising the steps of: boring a terminal attachment through-hole in a portion of a peripheral border of a metal terminal forming position; preparing an elastomer having a groove or a through-hole formed in a peripheral portion of the metal terminal forming position and a metallic member having a generally L shape or a straight-line shape; fitting the metallic member into the terminal attachment through-hole of the elastomer; folding the metallic member at one end side or both end sides thereof to form a metal terminal having an angular U shape; and making the elastomer at the metal terminal forming position to be firmly held between arm portions on both sides of the metal terminal, thereby obtaining the socket according to the present invention.

The present invention also provides a semiconductor device comprising the socket according to the above aspect of the invention, a printed circuit board, and an IC package, the printed circuit board and the IC package being electrically connected with each other through the intervention of the socket.

[Advantage of Second Aspect of the Invention]

The socket according to the second aspect of the invention has a socket terminal structure in which a metal terminal having an angular U shape is used as a contact terminal and in which a repulsive force thereof is secured by an elastomer firmly held by the metal terminal and has a configuration in which the elastomer has a groove or a through-hole formed in a peripheral portion of a metal terminal arrangement region and a terminal attachment through-hole formed in a portion of a peripheral border of the metal terminal arrangement region. Owing to such a configuration, it is possible to realize a socket with a small number of components and to thus provide a low-cost socket.

Moreover, by adjusting a dimension of the groove provided in a peripheral portion of the metal terminal arrangement region, it is possible to control the load-displacement characteristics to some extent. Therefore, it is easy to fabricate a variety of types of sockets having different load-displacement characteristics, and it is thus possible to cope with the requirements of a variety of types of sockets having different load-displacement characteristics.

Furthermore, since the contact portion is formed of a metal, it is possible to perform a plating treatment with the same metal as the connection terminal, and thus, a low contact resistance connection can be realized.

Furthermore, since a current flows through the metal terminal having an angular U shape, it is possible to realize a low inductance connection.

Furthermore, since the arm portions are sunken about the main columnar portion of the metal terminal having an angular U shape when a load is applied to the metal terminal, it is possible to realize a wiping function in which the metal terminal makes contact with opposing contact surfaces with the position thereof shifted while sliding on the opposing contact surfaces. Accordingly, it is possible to remove an oxide film or foreign materials on a metal surface, so that connection can be realized with fresh metal surfaces, and to thus more decrease the connection resistance.

Furthermore, since vertical contact can be carried out by means of a load-induced connection, it is possible to design a replaceable socket and to provide excellent maintenance properties as required for use in a server.

Furthermore, even when a substrate to be connected has some degree of warpage, since the elastomer might assume the warped shape, it is possible to reduce the influence of the warpage of the substrate.

Furthermore, since the elastomer is formed of a fluorine rubber, it is possible to provide high heat-resisting properties, and thus, a solder reflow process can be performed when the socket contact terminal is bonded to a substrate or a package. Therefore, it is possible to facilitate a bonding process and to thus decrease production costs.

Furthermore, by providing a groove in a peripheral portion of the metal terminal arrangement region of the elastomer, even when a number of metal terminals are arranged on one sheet of an elastomer, it is possible to eliminate any influence of the deformation in the elastomer on the metal terminal neighboring the groove. Moreover, since the groove does not penetrate through the elastomer, it is possible to provide stability to the metal terminal at the time of application of a load thereto.

Furthermore, by providing a through-hole in a peripheral portion of the metal terminal arrangement region of the elastomer so as to penetrate through the front and back surfaces thereof, it is possible to obviate the need to pay attention to the depth-directional control of the opening portion and to thus facilitate the fabrication of a socket.

Furthermore, since a convex portion is provided on an outer surface of each of the arm portions of the metal terminal, it is possible to provide predetermined load-displacement characteristics to a flat electrode as used in a printed circuit board or an LGA package and to thus broaden the application range of a socket.

Furthermore, in the socket according to the second aspect of the invention, by arranging a plurality of metal terminals on a plate-like elastomer, it is possible to provide a socket having a plurality of metal terminals at a low cost, and to increase the arrangement density of the metal terminals.

Furthermore, in accordance with the socket fabrication method according to the second aspect of the invention, it is possible to fabricate the socket according to the above aspect of the invention in a simple and efficient manner, and to thus fabricate a high-performance socket at a low cost.

Furthermore, since the semiconductor device according to the second aspect of the invention includes the socket according to the above aspect of the invention, a printed circuit board, and an IC package, the printed circuit board and the IC package being electrically connected with each other through the intervention of the socket, it is possible to provide a high-performance device or apparatus capable of coping with low resistance, large current and fast operation speed requirements.

According to a third aspect of the invention, there is provided a socket, comprising: an plate-like elastomeric member having a slit having an angular U shape or a generally U shape formed in a peripheral border of a metal terminal arrangement region and a tongue piece portion serving as the metal terminal arrangement region formed at an inner side of the slit; and a metal terminal having an angular U shape including a main columnar portion and arm portions configured to extend from both ends of the main columnar portion with the tongue piece portion being firmly held between the arm portions, wherein the main columnar portion of the metal terminal is formed at a protrusive distal end portion of the tongue piece portion and a terminal contact portion among the arm portions is arranged in the vicinity of a proximal end portion of the tongue piece portion.

In the socket according to the above aspect of the invention, it is preferable that the elastomeric member is a fluorinated elastomer.

In the socket according to the above aspect of the invention, it is preferable that a convex portion is provided on an outer surface of each of the arm portions of the metal terminal.

In the socket according to the above aspect of the invention, it is preferable that the metal terminal and the tongue piece portion have a structure in which they make a three- or more point contact, a surface contact, or a straight-line contact on one surface with each other.

In the socket according to the above aspect of the invention, it is preferable that a plurality of the metal terminals is provided in the elastomeric member.

In the socket according to the above aspect of the invention, it is preferable that one of the arm portions of the metal terminal is used as a soldering land and the other arm portion is used as a connection terminal of an IC package.

The present invention also provides a method of fabricating the socket according to the aspect of the invention, the method comprising the steps of: preparing a plate-like elastomeric member having a slit having an angular U shape or a generally U shape formed in a peripheral border of a metal terminal arrangement region and a tongue piece portion serving as the metal terminal arrangement region formed at an inner side of the slit and a metal terminal having an angular U shape; upwardly pressing or downwardly pulling the tongue piece portion of the elastomeric member so as to be projected from a front surface or a back surface of the elastomeric member and leaving it in this state; attaching the metal terminal to the tongue piece portion projected from the front surface or the back surface of the elastomeric member so that the tongue piece portion is firmly held between arm portions of the metal terminal; and making the tongue piece portion having the metal terminal attached thereto to be received in the slit, thereby obtaining the socket according to the present invention. The present invention also provides a method of fabricating the socket according to the aspect of the invention, the method comprising the steps of: preparing a plate-like elastomeric member having a slit having an angular U shape or a generally U shape formed in a peripheral border of a metal terminal arrangement region and a tongue piece portion serving as the metal terminal arrangement region formed at an inner side of the slit and a metallic member having a generally L shape or a straight-line shape; fitting the metallic member into the elastomeric member through the slit; and folding the metallic member at one end side or both end sides thereof to form a metal terminal having an angular U shape and making the tongue piece portion to be firmly held between arm portions on both sides of the metal terminal, thereby obtaining the socket according to the present invention.

The present invention also provides a semiconductor device comprising the socket according to the above aspect of the invention, a printed circuit board, and an IC package, the printed circuit board and the IC package being electrically connected with each other through the intervention of the socket.

[Advantage of Third Aspect of the Invention]

The socket according to the third aspect of the invention includes a plate-like elastomeric member having a slit having an angular U shape or a generally U shape formed in a peripheral border of a metal terminal arrangement region and a tongue piece portion serving as the metal terminal arrangement region at an inner side of the slit and a metal terminal having an angular U shape having a main columnar portion and arm portions configured to extend from both ends of the main columnar portion with the tongue piece portion being firmly held between the arm portions. Owing to such a configuration, it is possible to realize a low-cost socket with a small number of components.

Moreover, by adjusting a dimension of the elastomeric member, it is possible to control the load-displacement characteristics to some extent. Therefore, it is easy to fabricate a variety of types of sockets having different load-displacement characteristics, and it is thus possible to cope with the requirements of a variety of types of sockets having different load-displacement characteristics.

Furthermore, since the contact portion is formed of a metal, it is possible to perform a plating treatment with the same metal as the connection terminal, and thus, a low contact resistance connection can be realized.

Furthermore, since a current flows through the metal terminal having an angular U shape, it is possible to realize a low inductance connection.

Furthermore, since the arm portions are sunken about the main columnar portion of the metal terminal having an angular U shape when a load is applied to the metal terminal, it is possible to realize a wiping function in which the metal terminal makes contact with opposing contact surfaces with the position thereof shifted while sliding on the opposing contact surfaces. Accordingly, it is possible to remove an oxide film or foreign materials on a metal surface, so that connection can be realized with fresh metal surfaces, and to thus more decrease the connection resistance.

Furthermore, since vertical contact can be carried out by means of a load-induced connection, it is possible to design a replaceable socket and to provide excellent maintenance properties as required for use in a server.

Furthermore, even when a substrate to be connected has some degree of warpage, since the elastomer might assume the warped shape, it is possible to reduce the influence of the warpage of the substrate.

Furthermore, since the elastomer is formed of a fluorine rubber, it is possible to provide high heat-resisting properties, and thus, a solder reflow process can be performed when the socket is bonded to a substrate or a package. Therefore, it is possible to facilitate a bonding process and to thus decrease production costs.

Furthermore, since a convex portion is provided on an outer surface of each of the arm portions of the metal terminal, it is possible to provide predetermined load-displacement characteristics to a flat electrode as used in a printed circuit board or an LGA package and to thus broaden the application range of a socket.

Furthermore, since the metal terminal and the tongue piece portion have a structure in which they make a three- or more point contact, a surface contact, or a straight-line contact on one surface with each other, it is possible to make the metal terminal difficult to be removed from the elastomeric member. Moreover, even when the pressing and releasing operations are repeated, the metal terminal might not be removed, and it is thus possible to increase the reliability of a socket.

Furthermore, by arranging a plurality of metal terminals on a plate-like elastomer, it is possible to provide a socket having a plurality of metal terminals at a low cost, and to increase the arrangement density of the metal terminals.

Furthermore, in accordance with the socket fabrication method according to this aspect of the invention, it is possible to fabricate the socket according to the above aspect of the invention in a simple and efficient manner, and to thus fabricate a high-performance socket at a low cost.

Furthermore, since the semiconductor device according to this aspect of the invention includes the socket according to the above aspect of the invention, a printed circuit board, and an IC package, the printed circuit board and the IC package being electrically connected with each other through the intervention of the socket, it is possible to provide a high-performance device or apparatus capable of coping with low resistance, large current and fast operation speed requirements.

According to a fourth aspect of the invention, there is provided a socket, comprising: a contact terminal, including: a metal terminal having an angular U shape having a main columnar portion and arm portions configured to extend from both ends of the main columnar portion; and an elastomeric member firmly held between the arm portions on both sides; and a housing having formed therein a terminal insertion hole through which the contact terminal is inserted, wherein the terminal insertion hole has a hole dimension larger than the contact terminal, and wherein a sheet having formed therein openings for exposing portions of the arm portions is fixed on at least one of a front surface and a back surface of the housing so as to be in contact with the contact terminal in a state where the contact terminal is inserted into the terminal insertion hole.

In the socket according to the above aspect of the invention, it is preferable that the sheet is formed of an insulating material.

In the socket according to the above aspect of the invention, it is preferable that the sheet is formed of a metal, and the sheet has an independent structure for each contact terminal.

In the socket according to the above aspect of the invention, it is preferable that the sheet is provided on either one of the front surface or the back surface of the housing, and a bonding layer is provided on a portion of the sheet being in contact with the contact terminal.

In the socket according to the above aspect of the invention, it is preferable that the terminal insertion hole is designed to have such a hole dimension that a gap is formed in at least a portion of a region between the elastomeric member and an inner wall of the terminal insertion hole upon application of a load to the contact terminal.

In the socket according to the above aspect of the invention, it is preferable that a convex portion is provided on an outer surface of each of the arm portions.

The present invention also provides a semiconductor device comprising the socket according to the above aspect of the invention, a substrate, and an IC package, the substrate and the IC package being electrically connected with each other through the intervention of the socket.

[Advantage of Fourth Aspect of the Invention]

The socket according to the fourth aspect of the invention includes a contact terminal which includes a metal terminal having an angular U shape having a main columnar portion and arm portions configured to extend from both ends of the main columnar portion; and an elastomeric member firmly held between the arm portions on both sides; and a housing having formed therein a terminal insertion hole through which the contact terminal is inserted, in which the terminal insertion hole has a hole dimension larger than the contact terminal, and in which a sheet having formed therein openings for exposing portions of the arm portions is fixed on at least one of a front surface and a back surface of the housing so as to be in contact with the contact terminal in a state where the contact terminal is inserted into the terminal insertion hole. Owing to such a configuration, it is possible to mount a number of contact terminals in a housing with a high density and to thus realize a socket having a narrow pitch.

Furthermore, since the contact portion is formed of a metal, it is possible to perform a plating treatment with the same metal as the connection terminal, and thus, a low contact resistance connection can be realized.

Furthermore, since the arm portions are sunken into the elastomeric member about the main columnar portion of the metal terminal when a load is applied to a metal circuit, it is possible to realize a wiping function in which the metal terminal makes contact with opposing contact surfaces with the position thereof shifted while sliding on the opposing contact surfaces. Accordingly, it is possible to remove an oxide film or foreign materials on a metal surface, so that connection can be realized with fresh metal surfaces, and to thus realize a low resistance electrical connection.

Furthermore, since vertical contact can be carried out by means of a load-induced connection, it is possible to design a replaceable socket and to provide excellent maintenance properties as required for use in a server.

Furthermore, even when a substrate has some degree of warpage, since the elastomeric member might assume the warped shape, it is possible to reduce the influence of the warpage of the substrate.

Furthermore, since the terminal insertion hole has a hole dimension larger than the contact terminal, it is possible to easily insert the contact terminal into the terminal insertion hole of the housing. Therefore, it is possible to improve the assembly workability of a socket and to thus decrease fabrication costs.

Furthermore, since the sheet is formed of an insulating material, even when a number of contact terminals are mounted in the housing with a high density, it is possible to secure high insulating properties between individual contact terminals and to thus provide a highly reliable socket.

Furthermore, since the sheet is formed of a metal, and the sheet has an independent structure for each contact terminal, it is possible to use a metal sheet capable of preventing short-circuiting between terminals. Therefore, it is possible to provide a sufficient structure using a thin sheet and to thus increase the stroke of the contact terminal.

Furthermore, since the sheet is provided on either one of the front surface or the back surface of the housing, and a bonding layer is provided on a portion of the sheet being in contact with the contact terminal, it is possible to fix the contact terminal to the sheet on either the front or back surface side. Therefore, it is possible to decrease the number of components and production costs.

Furthermore, since the terminal insertion hole is designed to have such a hole dimension that a gap is formed in at least a portion of a region between the elastomeric member and an inner wall of the terminal insertion hole upon application of a load to the contact terminal, it is possible to maintain the stress-load characteristics of a single body of the contact terminal even after the socket has been assembled.

Furthermore, since a convex portion is provided on an outer surface of each of the arm portions, it is possible to provide predetermined load-displacement characteristics to a flat electrode as used in a printed circuit board or an LGA package and to thus broaden the application range of a socket.

Furthermore, since the semiconductor device according to this aspect of the invention includes the socket according to the above aspect of the invention, a printed circuit board, and an IC package, the printed circuit board and the IC package being electrically connected with each other through the intervention of the socket, it is possible to provide a high-performance device or apparatus capable of coping with low resistance, large current and fast operation speed requirements.

According to a fifth aspect of the invention, there is provided a socket, comprising: a contact terminal, including: a metal terminal having an angular U shape having a main columnar portion and arm portions configured to extend from both ends of the main columnar portion; and an elastomeric member firmly held between the arm portions on both sides; and a housing having formed therein a terminal insertion hole through which the contact terminal is inserted, wherein the terminal insertion hole has such a hole shape that it is able to firmly hold or engage with at least a portion of the contact terminal when the contact terminal is inserted therein.

In the socket according to the above aspect of the invention, it is preferable that the terminal insertion hole is designed to have a convex shape having an engagement portion to which the metal terminal of the contact terminal is press-fitted.

In the socket according to the above aspect of the invention, it is preferable that the terminal insertion hole is designed to have such a hole dimension that a gap is formed between an inner wall of the terminal insertion hole and the contact terminal in a state where the contact terminal is inserted therein.

In the socket according to the above aspect of the invention, it is preferable that the housing is formed of an elastomeric member.

In the socket according to the above aspect of the invention, it is preferable that the housing is formed of the same elastomeric member as the elastomeric member used for the contact terminal.

In the socket according to the above aspect of the invention, it is preferable that a convex portion is provided on an outer surface of each of the arm portions.

The present invention also provides a semiconductor device comprising the socket according to the above aspect of the invention, a substrate, and an IC package, the substrate and the IC package being electrically connected with each other through the intervention of the socket.

[Advantage of Fifth Aspect of the Invention]

The socket according to the fifth aspect of the invention includes a contact terminal which includes a metal terminal having an angular U shape having a main columnar portion and arm portions configured to extend from both ends of the main columnar portion; and an elastomeric member firmly held between the arm portions on both sides; and a housing having formed therein a terminal insertion hole through which the contact terminal is inserted, in which the terminal insertion hole has such a hole shape that it is able to firmly hold or engage with at least a portion of the contact terminal when the contact terminal is inserted therein. Owing to such a configuration, it is possible to mount a number of contact terminals in a housing with a high density and to thus realize a socket having a narrow pitch.

Furthermore, since the contact portion is formed of a metal, it is possible to perform a plating treatment with the same metal as the connection terminal, and thus, a low contact resistance connection can be realized.

Furthermore, since the arm portions are sunken into the elastomeric member about the main columnar portion of the metal terminal when a load is applied to a metal circuit, it is possible to realize a wiping function in which the metal terminal makes contact with opposing contact surfaces with the position thereof shifted while sliding on the opposing contact surfaces. Accordingly, it is possible to remove an oxide film or foreign materials on a metal surface, so that connection can be realized with fresh metal surfaces, and to thus realize a low resistance electrical connection.

Furthermore, since vertical contact can be carried out by means of a load-induced connection, it is possible to design a replaceable socket and to provide excellent maintenance properties as required for use in a server.

Furthermore, even when a substrate has some degree of warpage, since the elastomeric member might assume the warped shape, it is possible to reduce the influence of the warpage of the substrate.

Furthermore, since the terminal insertion hole is designed to have a convex shape having an engagement portion to which the metal terminal of the contact terminal is press-fitted, by designing a distal end portion of the engagement portion to be slightly shorter than the metal terminal of the contact terminal, the metal terminal of the contact terminal can be fixed at the housing, and thus, the contact terminal is made difficult to be removed.

Furthermore, since the terminal insertion hole is designed to have such a hole dimension that a gap is formed in at least a portion of a region between an inner wall of the terminal insertion hole and the contact terminal in a state where the contact terminal is inserted thereto, the elastomeric member expanded by being compressed upon application of a load to the contact terminal is received in the gap. Therefore, it is possible to prevent the housing and the elastomeric member from making frictional contact with each other, and thus, the contact terminal can maintain preset load-displacement characteristics.

Furthermore, by providing a beam part to the contact terminal so that the beam part is press-fitted to an engagement portion of the housing, it is possible to prevent the elastomeric member from making contact with the housing. Therefore, even when the contact terminal has been engaged with the housing, it is possible to maintain the load-displacement characteristics of a single body of the contact terminal.

Furthermore, since the housing is formed of an elastomeric member, even when a substrate has some degree of warpage, the housing might assume the warped shape of the substrate so that the substrate and the socket can be in close contact with each other, and it is thus possible to secure a high electrical connection.

Furthermore, since the semiconductor device according to this aspect of the invention includes the socket according to the above aspect of the invention, a printed circuit board, and an IC package, the printed circuit board and the IC package being electrically connected with each other through the intervention of the socket, it is possible to provide a high-performance device or apparatus capable of providing low resistance, large current and fast operation speed requirements.

BRIEF DESCRIPTION OF THE DRAWINGS

FIG. 1A is a side view of a contact terminal according to a first embodiment of the present invention.

FIG. 1B is a top plan view of the contact terminal.

FIG. 1C is a front view of the contact terminal.

FIG. 1D is a rear view of the contact terminal.

Figure 2:
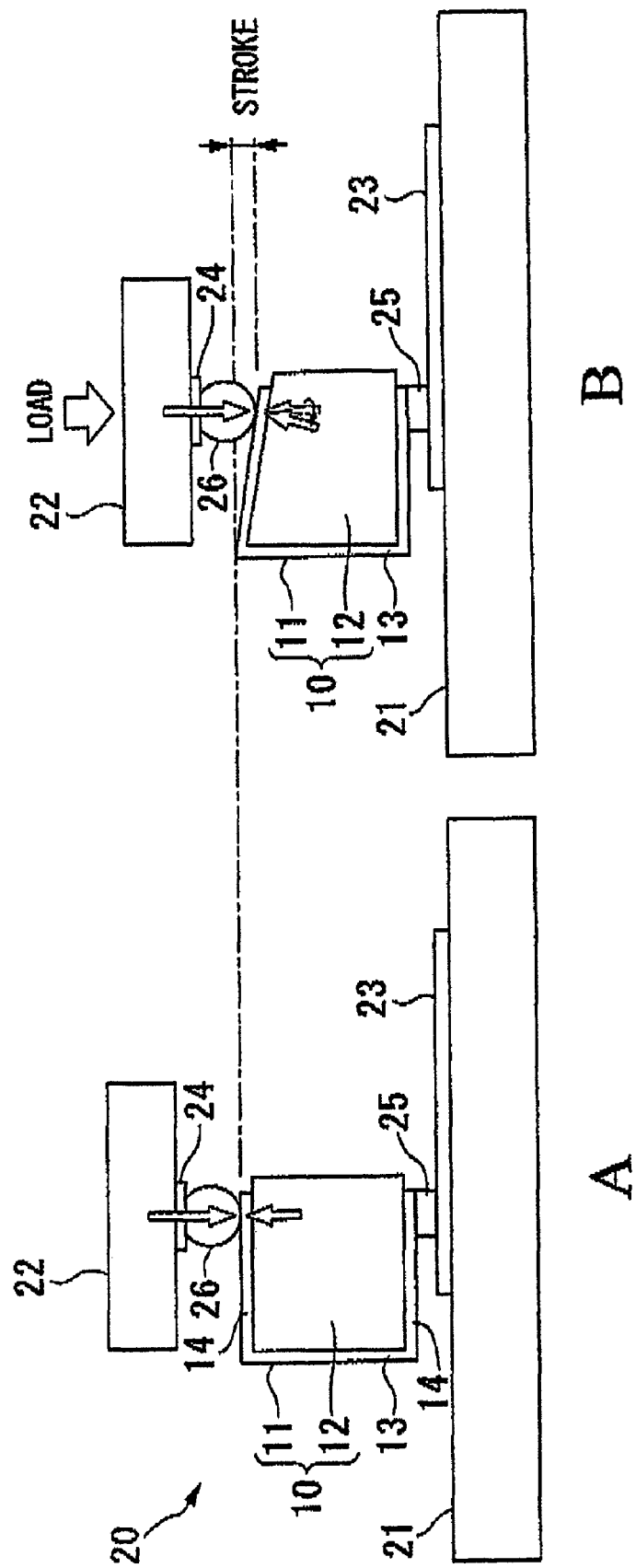
FIG. 2 is a side view of a structure of a printed circuit board, a contact terminal, and a BGA package, illustrating a state thereof prior to application of a pressing force thereto (or a restored state thereof after application of the pressing force thereto) and a state thereof at the time of application of the pressing force thereto, illustrating a contact operation when a BGA packaged IC socket is used as an example of a semiconductor device that uses the contact terminal according to the first embodiment.

DESCRIPTION OF SYMBOLS 10, 30: CONTACT TERMINAL
11, 31, 41: METAL TERMINAL
12: ELASTOMERIC MEMBER
13, 32, 42: MAIN COLUMNAR PORTION
14, 33, 43: ARM PORTION
15, 34: CONTACT PORTION
20, 50: SEMICONDUCTOR DEVICE
21, 51: PRINTED CIRCUIT BOARD
22: BGA PACKAGE (IC PACKAGE)
23, 53: CIRCUIT CONDUCTOR
24: ALUMINUM PAD
25: SOLDER
26: BGA TERMINAL SOLDER BALL
34, 44: WIDE AND THICK PORTION
35, 45: CONVEX PORTION
52: LGA PACKAGE (IC PACKAGE)
54: LGA LAND
55: ESCAPE SPACE
60: TABLE
61: HOUSING
62: FIXING PORTION
63: LOAD CELL
64: CONDUCTOR BAR
110, 116, 140: SOCKET
111, 141: ELASTOMER
112: GROOVE
113, 143: TERMINAL ATTACHMENT THROUGH-HOLE
114, 117, 144: METAL TERMINAL
114A: MAIN COLUMNAR PORTION
114B: ARM PORTION
115, 145: CONVEX PORTION
120, 130: SEMICONDUCTOR DEVICE
121, 131: PRINTED CIRCUIT BOARD
122: LGA PACKAGE (IC PACKAGE)
123, 133: CIRCUIT CONDUCTOR
124: LGA LAND
132: BGA PACKAGE (IC PACKAGE)
134: ALUMINUM PAD
135: SOLDER
136: BGA TERMINAL SOLDER BALL
142: THROUGH-HOLE
210, 230: SOCKET
211: ELASTOMER
212: SLIT
213: TONGUE PIECE PORTION
214, 231: METAL TERMINAL
214A, 231A: MAIN COLUMNAR PORTION
214B, 231B: ARM PORTION
220, 240: SEMICONDUCTOR DEVICE
221, 241: PRINTED CIRCUIT BOARD
222: BGA PACKAGE (IC PACKAGE)
223, 243: PATTERN WIRING
224: SOLDER
225: BGA TERMINAL SOLDER BALL
232: CONVEX PORTION
242: LGA PACKAGE (IC PACKAGE)
244: LGA LAND
310, 320, 330: SOCKET
311: HOUSING
312: TERMINAL INSERTION HOLE
313: CONTACT TERMINAL
314: ELASTOMERIC MEMBER
315: METAL TERMINAL
315A: MAIN COLUMNAR PORTION
315B: ARM PORTION
315C: CONVEX PORTION
316: GAP
317, 321: SHEET
318: OPENING PORTION
331: ADHESIVE MATERIAL
410, 420, 430, 441, 443: SOCKET
411, 450: HOUSING
412, 451: TERMINAL INSERTION HOLE
413: CONTACT TERMINAL
414, 452: ELASTOMERIC MEMBER
415: METAL TERMINAL
415A: MAIN COLUMNAR PORTION
415B: ARM PORTION
415C: CONVEX PORTION
416: GAP
417: SHEET
418: OPENING
421, 432: ENGAGEMENT PORTION
431: BEAM PART
440: IC PACKAGE
442: BOARD
444: SEMICONDUCTOR DEVICE

BEST MODE FOR CARRYING OUT THE INVENTION

A detailed description of embodiments of the present invention will be provided hereinbelow with reference to FIGS. 1A to 29B.

(Embodiment 1)

A description of an embodiment of the present invention will be provided with reference to the drawings.

FIGS. 1A to 1D are views illustrating a socket contact terminal (hereinafter referred to simply as a contact terminal) according to a first embodiment of the present invention, in which FIG. 1A is a side view of the contact terminal 10, FIG. 1B is a top plan view thereof, FIG. 1C is a front view thereof, and FIG. 1D is a rear view thereof. In the drawing figures, reference numeral 10 designates a contact terminal, 11 designates a metal terminal, 12 designates an elastomeric member, 13 designates a main columnar portion, 14 designates an arm portion, and 15 designates a contact portion.

The contact terminal 10 according to the present embodiment is configured to provide electrical connection between a connection portion formed of a metal conductor on a printed circuit board and a connection terminal of an IC package and includes a metal terminal 11 having an angular U shape including a main columnar portion 13 and arm portions 14 on both sides thereof; and a rectangular parallelepiped elastomeric member 12 attached to the metal terminal 11, in which a metal surface is exposed from an outer surface of each of the arm portions 14 of the metal terminal 11, and in which the elastomeric member 12 is firmly held between the arm portions 14 of the metal terminal 11 so as to exhibit a repulsive force when the arm portions 14 are pressed in the direction that the arm portions 14 approach each other.

The metal terminal 11 is suitably formed of materials having good conductive properties such as copper or brass, and it is preferable to apply gold plating to a surface thereof in order to decrease a contact resistance. In the case of applying gold plating to copper, nickel plating is usually applied to an underlying layer as a diffusion blocking layer.

A height A of the elastomeric member 12 firmly held in the metal terminal 11 is preferably equal to an inside height B of the metal terminal 11, and a width C of the elastomeric member 12 is preferably equal to or slightly larger than a width D of each of the arm portions 14 of the metal terminal 11. Moreover, a total terminal length E is preferably equal to or slightly larger than a length F of each of the arm portions 14. Furthermore, a height G of the main columnar portion is equal to a height H of the contact portion.

The contact terminal 10 according to the present embodiment has a structure in which the metal terminal 11 is formed of a material having some degree of softness such as pure copper that does not basically exhibit a repulsive force, while the elastomeric member 12 exhibits a repulsive force when the arm portions 14 are pressed. By having such a structure, it is possible to prevent breaking of the metal terminal 11 even under repeated application of a load thereto and to make the metal terminal 11 difficult to be removed from the elastomeric member 12. The metal terminal 11 might not be able to be restored to its original state when a load is applied to deform a portion of the metal terminal 11 where the elastomeric member 12 is not provided. In order to prevent this, it is preferable that the elastomeric member 12 has a size that it makes contact with substantially the entire inner surface of the metal terminal 11.

Next, a description of a contact operation of the contact terminal 10 according to 20 the present embodiment will be provided.

FIGS. 2A and 2B are views illustrating a contact operation when a BGA packaged IC socket is used as an example of a semiconductor device that uses the contact terminal 10 according to the present embodiment. FIG. 2 is a side view of a structure of a printed circuit board, a contact terminal, and a BGA package, illustrating the state thereof prior to application of a pressing force thereto (or the restored state thereof after application of the pressing force thereto) and the state thereof at the time of application of the pressing force thereto.

In the drawings, reference numeral 20 designates a semiconductor device, 21 designates a printed circuit board, 22 designates a BGA package (an IC package), 23 designates a circuit conductor, 24 designates an aluminum pad, 25 designates solder, and 26 designates a BGA terminal solder ball.

Although when the contact terminal 10 is used as a socket, it is typically necessary to align contact terminals by means of a housing or the like in any method to be fixed to the housing or the like, such portions are omitted in the drawings in order to describe the sole operation of the contact terminal 10.

When the contact terminal 10 according to the present embodiment is connected to the circuit conductor (terminal) 23 on the printed circuit board 21, paste solder is preliminarily applied at necessary locations of the printed circuit board 21, and the printed circuit board 21 is passed through a reflow furnace to be soldered to the contact terminal 10 mounted thereon, so that they are electrically connected with each other. In this case, the elastomeric member 12 preferably has heat-resisting properties capable of enduring the reflow treatment temperature. Since fluorine rubbers being elastomeric members having excellent heat-resisting properties are available as a commercialized product capable of enduring the reflow treatment temperature, a fluorine rubber is preferably used.

The state where the contact terminal 10 is mounted on the printed circuit board 21 and the BGA package 22 is placed thereon is illustrated in the left part of FIG. 2. In this case, it is preferable that the center of the BGA terminal solder ball 26 of the BGA package 22 is aligned to be disposed slightly at an inner side of a distal end of the arm portion 14 of the metal terminal 11 so that it does not deviate from the metal terminal portion at the time of application of a load thereto. The state thereof at the time of application of a load thereto in such a state is illustrated in the right part of FIG. 2.

When a load is applied to the semiconductor device 20, the elastomeric member 12 of the contact terminal 10 is compressed to be sunken while generating a repulsive force in response to the compression. The load and sinking relationship corresponds to load-stroke characteristics.

Moreover, since the arm portions 14 of the metal terminal 11 are sunken about a portion thereof being joined with the main columnar portion 13, the contact point will be moved toward the main columnar portion 13 when a load is applied thereto, and thus, a wiping effect is carried out. Accordingly, it is possible to remove an oxide film generated on both metal surfaces, so that connection can be realized with fresh metal surfaces, and to thus realize a low resistance electrical connection.

Furthermore, as a matter of course, the height or width dimension of the elastomeric member 12 needs to be designed to have repulsive properties capable of satisfying necessary load-stroke characteristics, and it is particularly necessary to design the height dimension of the elastomeric member 12 to a size at least larger by the amount of stroke.

(Embodiment 2)

Figure 3A:
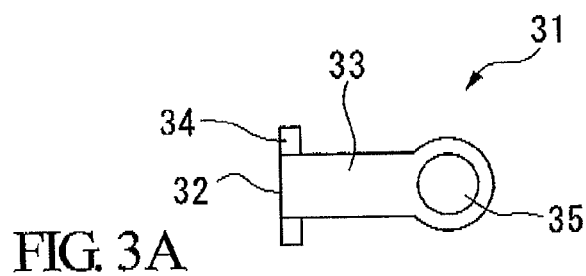
FIG. 3A is a top plan view of a metal terminal as a contact terminal according to a second embodiment of the present invention.
Figure 3B:
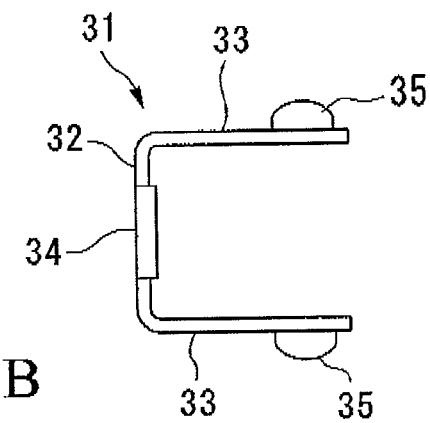
FIG. 3B is a side view of the metal terminal as the contact terminal according to the second embodiment of the present invention.
Figure 3C:
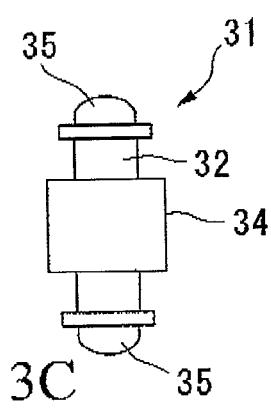
FIG. 3C is a rear view of the metal terminal as the contact terminal according to the second embodiment of the present invention.

FIGS. 3A to 3C are views illustrating a contact terminal according to a second embodiment of the present invention. In FIG. 3, only a metal terminal 31 of the contact terminal 30 according to the present embodiment is illustrated. FIG. 3A is a top plan view of the metal terminal 31, FIG. 3B is a side view thereof, and FIG. 3C is a rear view thereof. In the drawings, reference numeral 31 designates a metal terminal, 32 designates a main columnar portion, 33 designates an arm portion, 34 designates a wide and thick portion, and 35 designates a dome-shaped convex portion.

The contact terminal 30 according to the present embodiment includes substantially the same components as those of the contact terminal 10 according to the first embodiment described above, and is characterized in that a dome-shaped convex portion 35 is provided on an outer surface of each of the arm portions 33 of the metal terminal 31, and that a wide and thick portion 34 is provided on a central portion of the main columnar portion 32 so as to have a width and a thickness larger than other portions.

Although the first embodiment described above has been described for a contact structure having a protrusion such as a solder ball on a terminal portion of an IC package such as a BGA package, the IC package is not limited to the BGA package but may be an LGA package where a terminal of the IC package is configured as a land structure. Moreover, as in the case of server sockets, in order to replace contact portions at the time of maintenance, a printed circuit board-side end thereof is not soldered but connected to a printed circuit board in a land state. In such a case, when a metal terminal having a simple angular U shape is used, it is difficult to secure a stroke that allows the contact portion to be sunken and unable to satisfy the load-stroke characteristics required for connection with a suitable contact resistance. However, by modifying the shape of the contact portion, it may be applied to such a case. The contact terminal 30 according to the present embodiment has a structure in which the dome-shaped convex portions 35 are provided on outer surface portions serving as contact portions of the arm portions 33 of the metal terminal 31 having an angular U shape so that a stroke can be produced by the height of the convex portion 35, in order to be suitably used when it is applied to electrical connection with a land of an LGA package or a land of a printed circuit board.

In FIG. 3, the contact portion is pressed into a dome shape to thereby form the convex portion 35, so that a height thereof corresponding to a necessary stroke can be obtained. In this way, when a load is applied thereto, the contact portion can be sunken into the elastomeric member 12 by an amount corresponding to the height of the convex portion 35 even when a counterpart terminal contacted therewith is flat, and thus can be contacted with a land. In such a case, since the arm portion 33 is sunken into the elastomeric member 12 about a proximal end of the arm portion 33, it is possible to realize the same wiping effect as that provided by the contact terminal 10 according to the first embodiment. Moreover, since gold plating is often applied to terminals of the LGA package, in this sense, it is preferable to apply gold plating to at least a surface of the convex portion 35 in order to realize a low contact resistance.

Figure 5:
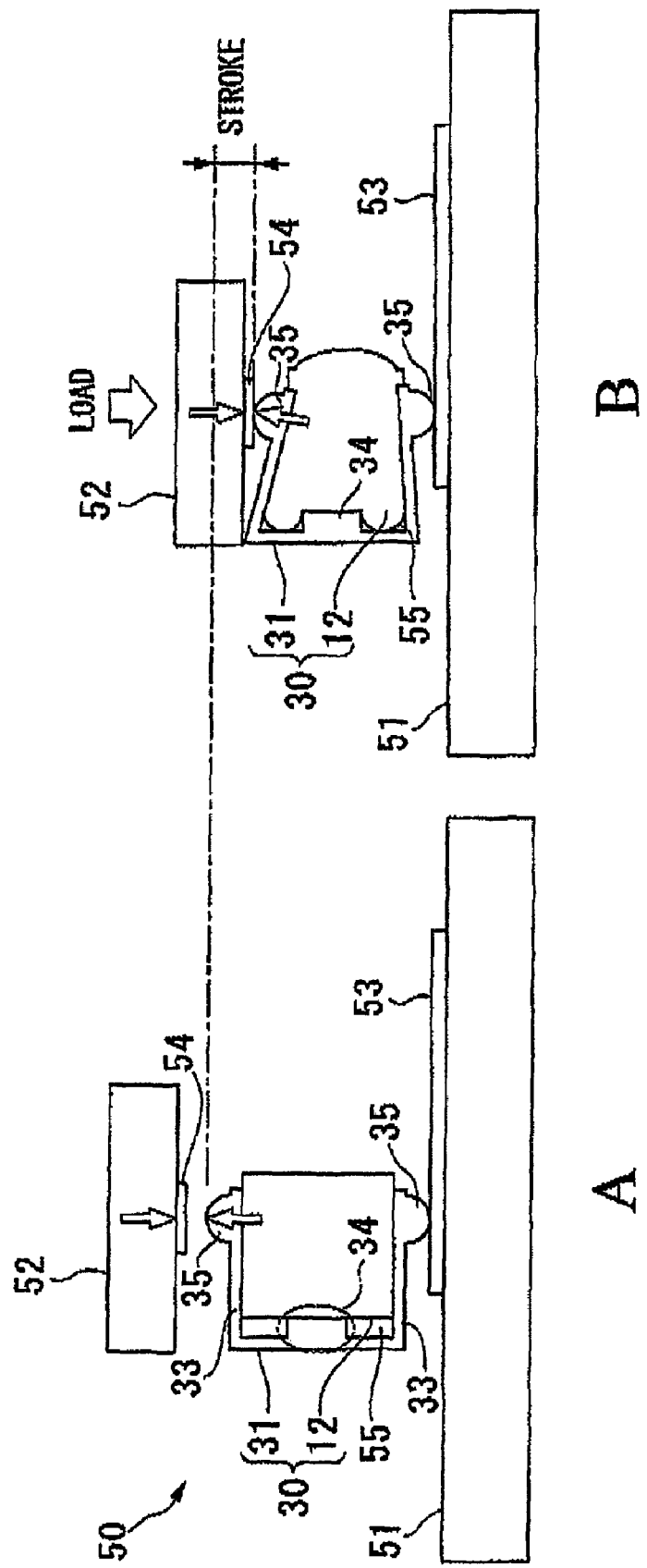
FIG. 5 is a side view of a structure of a printed circuit board, a contact terminal, and an LGA package, illustrating a state thereof prior to application of a pressing force thereto (or a restored state thereof after application of the pressing force thereto) and a state thereof at the time of application of the pressing force thereto, illustrating a contact operation when an LGA packaged IC socket is used as an example of a semiconductor device that uses the contact terminal according to the second embodiment.

FIG. 5 is a view illustrating a contact operation when an LGA packaged IC socket is used as an example of a semiconductor device that uses the contact terminal 30 according to the present embodiment. FIG. 5 illustrates a side view of a structure of a printed circuit board, a contact terminal, and an LGA package, illustrating the state thereof prior to application of a pressing force thereto (or the restored state thereof after application of the pressing force thereto) and the state thereof at the time of the application of pressing force thereto. In the drawings, reference numeral 50 designates a semiconductor device, 51 designates a printed circuit board, 52 designates an LGA package (IC package), 53 designates a circuit conductor, 54 designates an LGA land, and 55 designates an escape space of an elastomeric member.

As will be understood from FIG. 5, the contact terminal 30 according to the present embodiment is able to secure a maximum stroke corresponding to the sum of the heights of the upper and lower convex portions 35.

Furthermore, the metal terminal 31 according to the present embodiment is further modified. As illustrated in FIGS. 3A to 3C, the wide and thick portion 34 is provided on the central portion of the main columnar portion 32 of the metal terminal 31 so as to have a width and a thickness larger than other portions. Owing to such a configuration, it is possible to provide the advantage of decreasing electrical resistance.

Moreover, it is possible to form the escape space 55 of the elastomeric member so that upon application of a pressing force to the arm portions as illustrated in the right part of FIG. 5, the elastomeric member 12 can be deformed to escape toward both sides of the wide and thick portion 34.

In this way, it is possible to provide a space for allowing escape of the elastomeric member 12 at the time of application of a load, decrease the frictional force generated between the elastomeric member 12 and the metal terminal 31, and obtain a larger stroke with a lower load. Moreover, since it is possible to realize a structure in which the elastomeric member 12 is firmly held between both arm portions 33 while providing the escape space to the elastomeric member 12, it is possible to make the elastomeric member 12 difficult to be removed from the metal terminal 31 at the time of application of a load thereto.

As described above, in accordance with the contact terminal according to the present invention, it is possible to provide a contact terminal capable of providing a large stroke with a low load at a low contact resistance even when it is used in a BGA package having a convex terminal portion or in an LGA package or a printed circuit board having a flat terminal land.

The contact terminal according to the present invention can be fabricated using an existing metal part processing technique, e.g., by means of pressing or metal molding. Moreover, the plating treatment may use general nickel plating or gold plating techniques, and it is possible to cope with the fine pitch requirements within the range obtainable by such techniques. Furthermore, the elastomeric member may be produced by a method of extruding a liquid raw material into a plate shape and cutting into a desired size or a method of realizing a desired shape by injection molding, and such methods are also available from an existing fabrication technique.

(Embodiment 3)

Figure 4A:
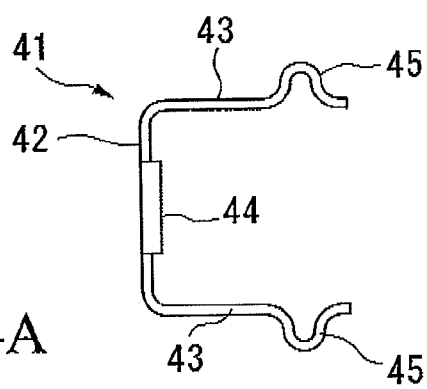
FIG. 4A is a side view of a metal terminal as a contact terminal according to a third embodiment of the present invention.
Figure 4B:
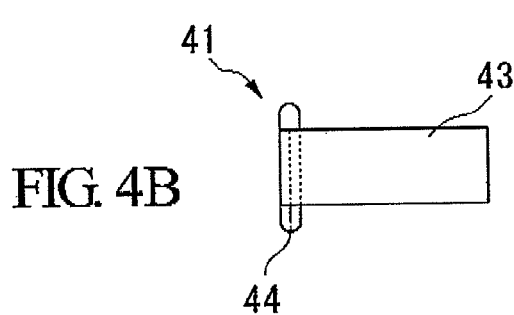
FIG. 4B is a top plan view of the metal terminal as the contact terminal according to the third embodiment of the present invention.
Figure 4C:
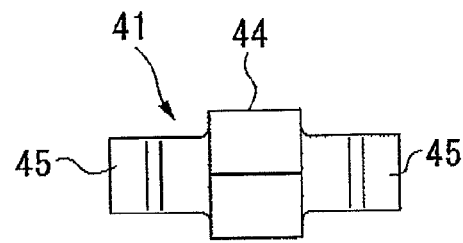
FIG. 4C is a rear view of the metal terminal as the contact terminal according to the third embodiment of the present invention.

FIG. 4 is a view illustrating a contact terminal according to a third embodiment of the present invention. In FIG. 4, only a metal terminal 41 of the contact terminal according to the present embodiment is illustrated. FIG. 4A is a side view of the metal terminal 41, FIG. 4B is a top plan view thereof, and FIG. 4C is a rear view thereof. In the drawing, reference numeral 41 designates a metal terminal, 42 designates a main columnar portion, 43 designates an arm portion, 44 designates a wide and thick portion, and 45 designates a semi-cylindrical convex portion.

The contact terminal according to the present embodiment includes substantially the same components as those of the contact terminal 30 according to the second embodiment described above, and is characterized in that a semi-cylindrical convex portion 45 is provided on each of the arm portions 43 of the metal terminal 41 by means of bending. Moreover, similar to the contact terminal 30 according to the second embodiment, the wide and thick portion 44 is provided on the central portion of the main columnar portion 42, and the wide and thick portion 44 can be realized by folding. Since such a shape can be realized by merely folding a starting material having the same thickness as a final plate thickness, it is extremely easy to process and thus, low-cost production equipment can be used.

EXAMPLES

An experiment was conducted using an LGA socket contact terminal having a pitch of 1 mm by mounting an elastomeric member having a hardness of 50 and cut into a rectangular shape on the metal terminal illustrated in FIG. 3.

Figure 6:
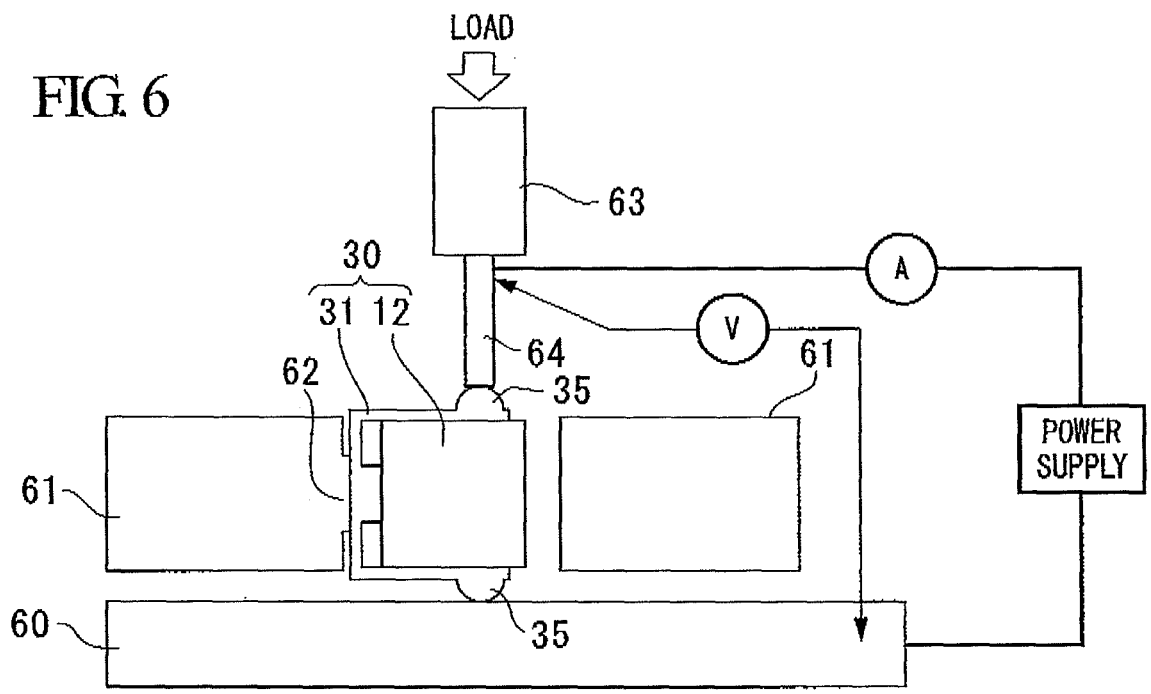
FIG. 6 is a side view illustrating an experimental system used in the Examples.

The experimental system used is illustrated in FIG. 6. In FIG. 6, reference numeral 60 designates a table formed of a conductor, 61 designates a housing, 62 designates a fixing portion, 63 designates a load cell, and 64 designates a conductor bar.

Using the experimental system, the load cell 63 was moved up and down to apply a predetermined load to the contact terminal 30, and the displacement (mm) at that moment was measured.

Figure 7:
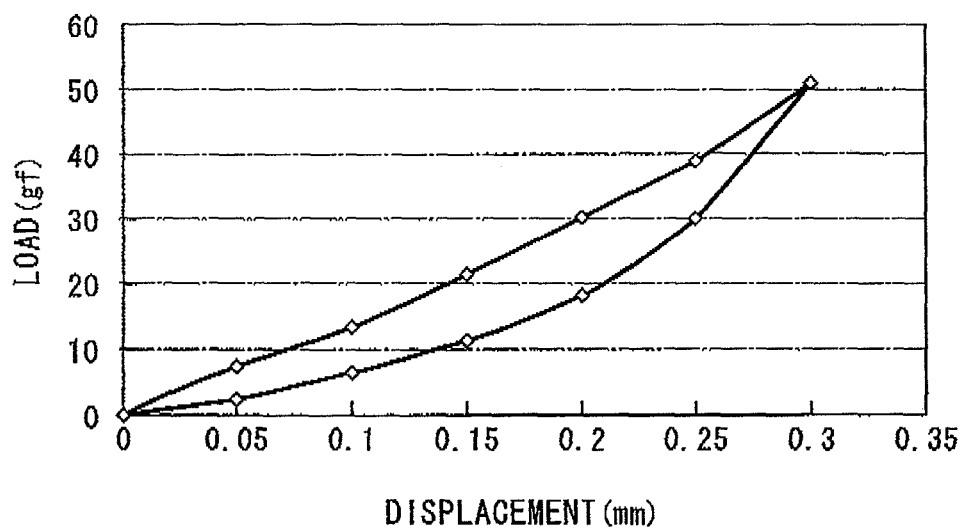
FIG. 7 is a graph showing load-displacement characteristics of the contact terminal measured in the Examples.

The load-displacement characteristics measured through the experiment are illustrated in FIG. 7. From the measurement results, it was confirmed that it is possible to satisfy displacement characteristics of 0.3 mm at a load of 50 gf as required in the field of IC sockets.

Moreover, in the experimental system, electrical characteristics of the contact terminal 30 were examined by applying a voltage across the table 60 and the conductor bar 64 electrically connected with each other through the intervention of the contact terminal 30 and measuring the current flowing therethrough and the voltage applied thereto. The measurement results of the electrical characteristics are shown in Table 1.

TABLE 1

| Electrical Characteristics | Measurement Value | Note |
|---|---|---|
| Inductance (nH) | 0.8 | at 500 MHz |
| Resistance (mΩ) | 10 | at 50 gf |

From the above results, it can be concluded that it is possible to realize a socket having a low resistance and a low inductance by using the contact terminal 30.

(Embodiment 4)

Next, a description of an embodiment of the present invention will be provided with reference to the drawings.

Figure 8:
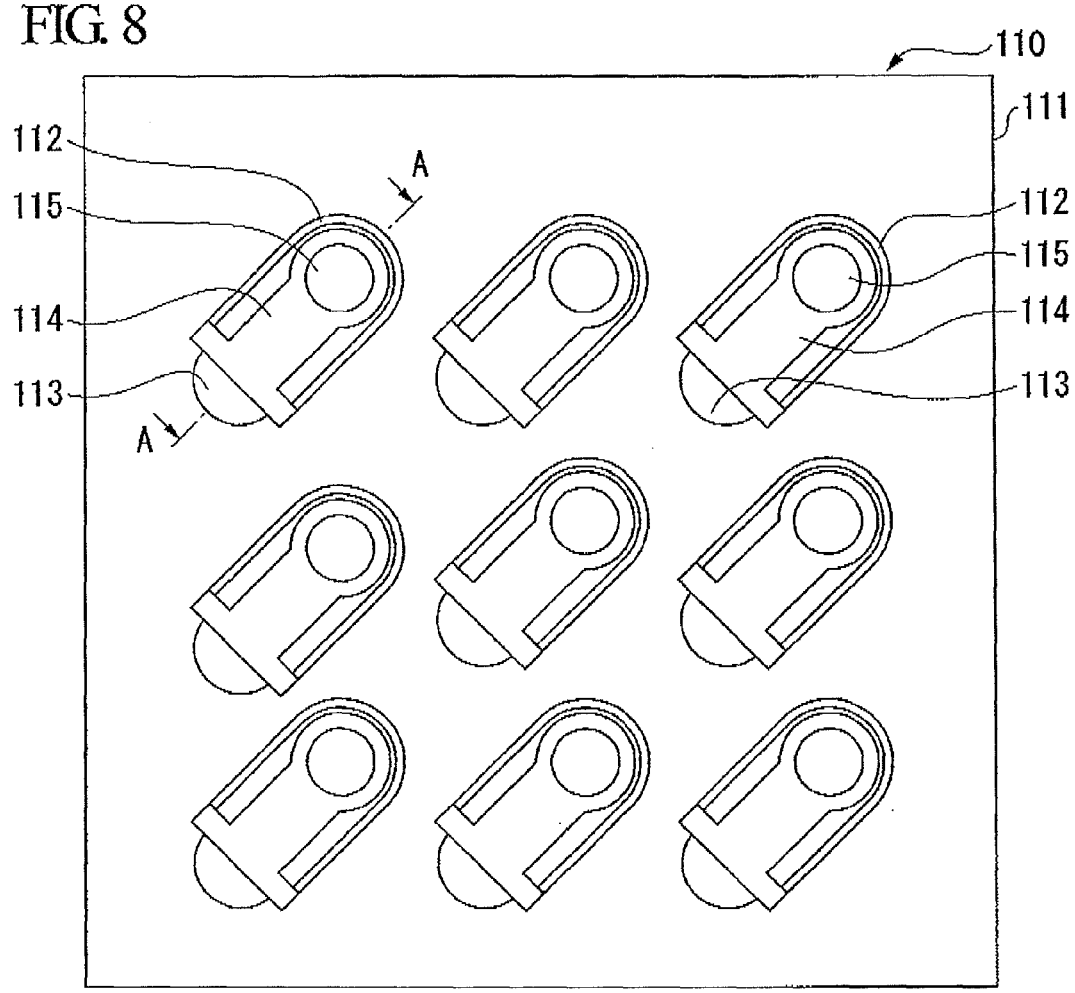
FIG. 8 is a top plan view of a socket according to a fourth embodiment of the present invention.
Figure 9:
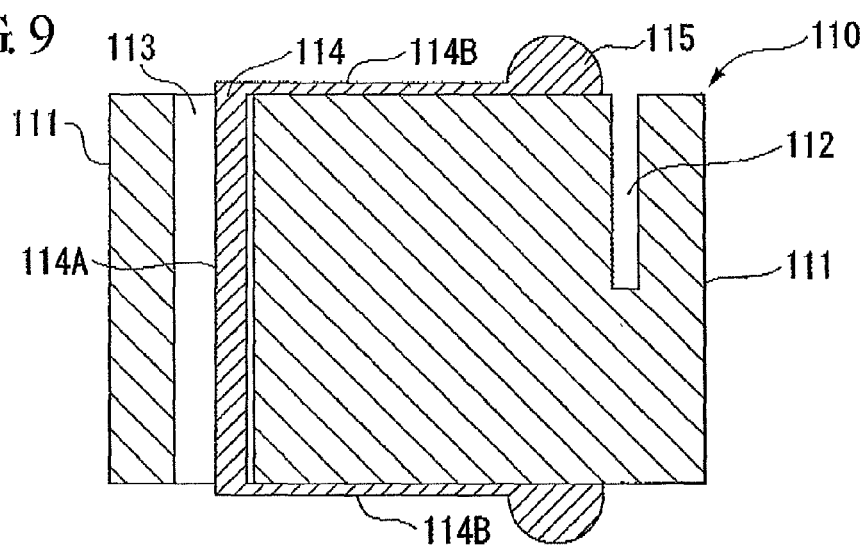
FIG. 9 is a cross-sectional view taken along the line A-A' in FIG. 1.

FIGS. 8 and 9 are views illustrating a socket according to a fourth embodiment of the present invention, in which FIG. 8 is a top plan view of a socket 110 according to the present embodiment, and FIG. 9 is a cross-sectional view taken along the line A-A' in FIG. 8. In the drawings, reference numeral 110 designates a socket, 111 designates an elastomer, 112 designates a groove, 113 designates a terminal attachment through-hole, 114 designates a metal terminal, 114A designates a main columnar portion, 114B designates an arm portion, and 115 designates a convex portion.

The socket 110 according to the present embodiment includes an elastomeric member 111 having a groove 112 formed in a peripheral portion of a metal terminal arrangement region and a terminal attachment through-hole 113 formed in a portion of a peripheral border of the metal terminal arrangement region; and a metal terminal 114 having an angular U shape including a main columnar portion being in contact with an inner surface of the terminal attachment through-hole 113 and arm portions configured to extend from both ends of the main columnar portion along both front and back surfaces of the elastomeric member 111 to the metal terminal arrangement region. In the example illustrated in FIG. 8, a configuration in which a plurality of metal terminals 114 is arranged on a plate-like elastomeric member 111 is shown.

The socket has a basic structure in which the terminal attachment through-hole 113 is provided in the elastomeric member 111 so that the metal terminal 114 can pass through the terminal attachment through-hole 113, and the metal terminal 114 having an angular U shape is provided in the terminal attachment through-hole so that the elastomeric member 111 is firmly held by the metal terminal 114. Moreover, the socket is characterized in that at least a portion of a peripheral portion of the elastomeric member 111 being in contact with the metal terminal 114 on the front and back surfaces of the elastomeric member 111 is removed so that transmission of a force generated between neighboring terminals by the extension and compression of the elastomer in the state of a load being applied thereto is diminished.

By having the above-described structure, in the socket 110 according to the present embodiment, the load-stroke characteristics can be designed by using the characteristics of the elastomeric member 111 while having a metal contact. Since the contact portion is sunken about the base of the metal terminal 114 having an angular U shape, it is possible to realize the wiping effect.

Furthermore, since a current flows through the metal terminal 114 having an angular U shape, it is possible to realize a low inductance connection by decreasing the electrical conduction path, and to thus provide a socket capable of coping with low resistance, large current and fast operation speed requirements.

Furthermore, since an elastomer portion for providing a repulsive force being firmly held by the metal terminal 114 having an angular U shape and a positioning support plate for connecting terminals with each other can be formed by the same elastomeric member 111, it is possible to fabricate the socket by merely sandwiching the metal terminal 114 having an angular U shape into an elastomer plate having been subjected to predetermined hole processing and to thus provide a socket at a low cost.

The metal terminal 114 having an angular U shape as illustrated in FIGS. 8 and 9 is suitably formed of materials having good conductive properties such as copper or brass, and it is preferable to apply gold plating to an outer surface thereof in order to decrease contact resistance. In the case of applying gold plating to copper, nickel plating is usually applied to an underlying layer as a diffusion blocking layer.

The height of the elastomeric member 111 firmly held in the metal terminal 114 having an angular U shape is preferably equal to an inside height dimension of the metal terminal 114.

Moreover, when the width of the groove 112 provided on a peripheral portion of the elastomer 111 firmly held in the metal terminal 114 is too narrow, the elastomeric member 111 pressed at the time of application of a load to the metal terminal 114 may interfere with a side wall of the groove 112, and thus, the load necessary for obtaining a predetermined displacement amount is increased. Moreover, it becomes difficult to diminish transmission of a force generated by the extension and compression of the elastomeric member 111 to the neighboring metal terminals 114. On the other hand, when the width of the groove 112 provided on the peripheral portion of the elastomeric member 111 firmly held in the metal terminal 114 is too large toward the outside of the metal terminal 114, the distance between metal terminals may increase, and thus, it is difficult to realize a socket having a fine pitch.

Furthermore, when the width of the groove 112 provided on the peripheral portion of the elastomeric member 111 firmly held in the metal terminal 114 is too large toward the inside of the metal terminal 114, in other words, when the volume of the portion of the elastomeric member 111 being firmly held in the metal terminal 114 is decreased, it is difficult to obtain a sufficient repulsive force of the elastomeric member 111.

By the reasons described above, it is preferable that a width of a portion (the inner portion of the groove 112) of the elastomeric member 111 being firmly held in the metal terminal 114 is equal to or slightly larger than the area of the metal terminal 114. In other words, by adjusting the dimension of the groove 112, it is possible to control the load-displacement characteristics of each terminal.

Furthermore, although the groove 112 may be configured to penetrate through the elastomeric member 111, when it is configured to not penetrate through the elastomeric member 111, the elastomeric member 111 firmly held in the metal terminal 114 can be fixed. Therefore, it is possible to obtain the advantage of preventing an occasion where the elastomeric member 111 becomes unstable upon application of a load to the metal terminal 114, and the metal terminal 114 slips on the surface of the elastomeric member 111, and thus, the metal terminal 114 drops off from the surface of the elastomeric member 111.

Next, a description of a contact operation of the socket 110 according to the present embodiment will be provided.

Figure 10:
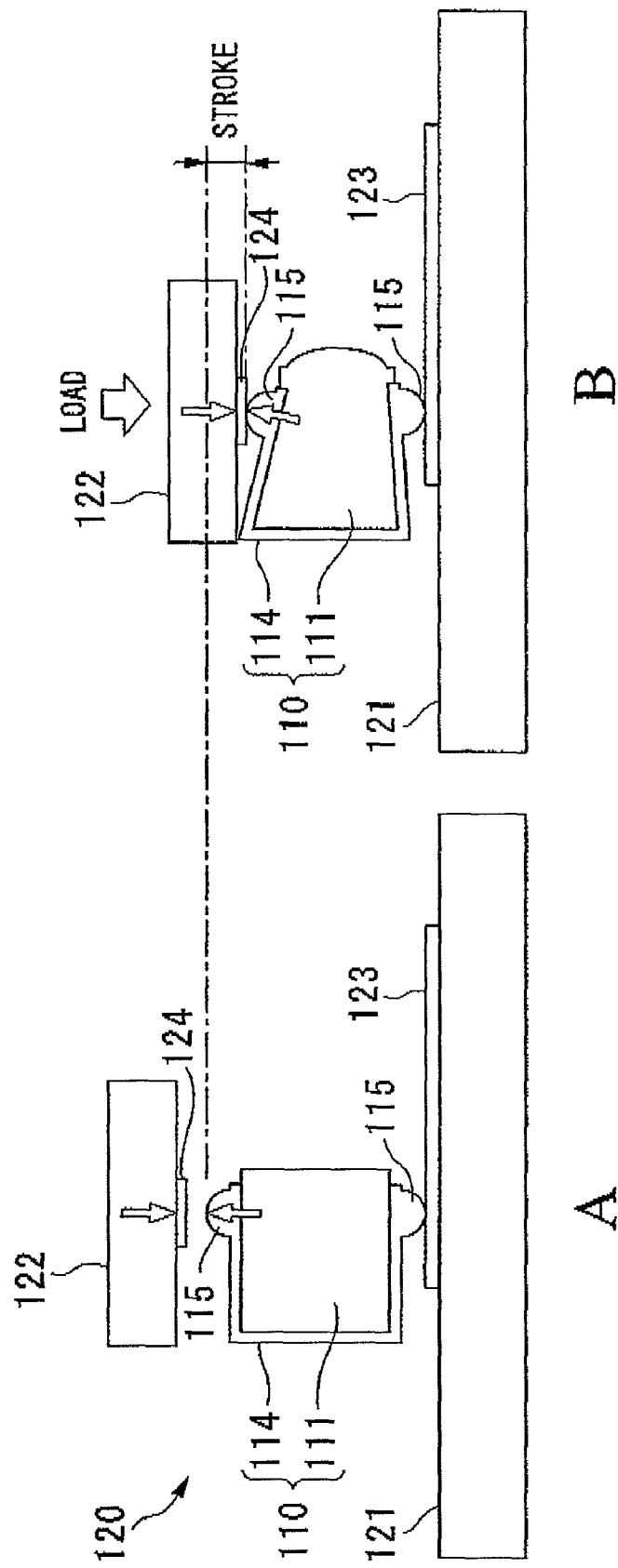
FIG. 10 is a side view of a semiconductor device illustrating a state thereof prior to application of a pressing force thereto (or a restored state thereof after application of the pressing force thereto) and a state thereof at the time of application of the pressing force thereto, illustrating a contact operation when the socket according to the fourth embodiment is used as an LGA packaged IC socket as an example of a semiconductor device that uses the socket according to the fourth embodiment.

FIG. 10 is a view illustrating a contact operation when the socket 110 according to the fourth embodiment described above is used as an LGA packaged IC socket as an example of a semiconductor device that uses the socket 110 according to the present embodiment, the LGA packaged IC socket being used for the case where a terminal of the IC package is configured as a land structure or the case where in order to replace contact portions at the time of maintenance, a printed circuit board-side end thereof is not soldered but connected to a printed circuit board in a land state as in the case of server sockets. FIG. 10A is a side view of a semiconductor device 120 illustrating the state thereof prior to application of a pressing force thereto (or the restored state thereof after application of the pressing force thereto), and FIG. 10B is a side view of the semiconductor device 120 illustrating the state thereof at the time of application of the pressing force thereto. In the drawings, reference numeral 120 designates a semiconductor device, 121 designates a printed circuit board, 122 designates an LGA package (IC package), 123 designates a circuit conductor, and 124 designates an LGA land.

The semiconductor device 120 has a structure in which one of the arm portions of the socket 110 is placed on the circuit conductor 123 of the printed circuit board 121 and the other arm portion of the socket 110 is in abutting contact with the LGA land 124 of the LGA package 122. As illustrated in the drawings, the socket 110 according to the present embodiment has a structure in which the convex portions 115 are provided on the metal terminal 114 having an angular U shape so that a stroke can be produced by the height of the convex portions 115.

The state thereof at the time of application of a load thereto in such a state is illustrated in FIG. 10B. When a load is applied thereto, the elastomeric member 111 is compressed to be sunken while generating a repulsive force in response to the compression. The load and sinking relationship corresponds to load-stroke characteristics. Moreover, since the arm portions of the metal terminal 114 are sunken about a portion thereof being joined with the main columnar portion, the contact point will be moved toward the main columnar portion when a load is applied thereto, and thus, a wiping effect is carried out. Accordingly, it is possible to remove an oxide film, so that connection can be realized with fresh metal surfaces, and to thus realize a low resistance electrical connection. Furthermore, as a matter of course, a height or width dimension of the elastomeric member 111 needs to be designed to have repulsive properties capable of satisfying necessary load-stroke characteristics, and it is particularly necessary to design the height dimension of the elastomeric member 111 to a size at least larger by the amount of stroke.

(Embodiment 5)

Figure 11:
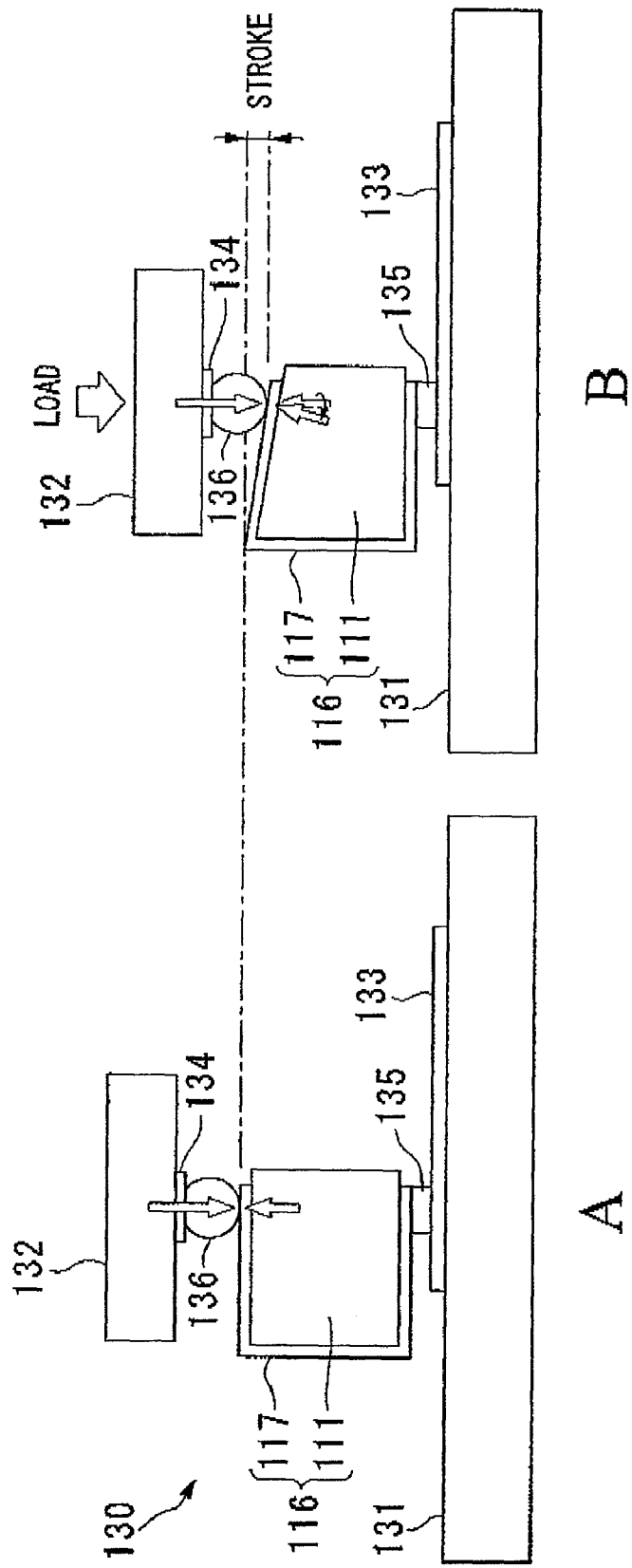
FIG. 11 is a side view of a socket according to a fifth embodiment of the present invention and a semiconductor device using the socket, illustrating a state thereof prior to application of a pressing force thereto (or a restored state thereof after application of the pressing force thereto) and a state thereof at the time of application of the pressing force thereto, illustrating a contact operation when the socket according to the fifth embodiment is used as a BGA packaged IC socket as an example of a semiconductor device that uses the socket according to the fifth embodiment.

FIG. 11 is a view of a socket according to a fifth embodiment of the present invention, illustrating a contact operation when the socket 116 according to the fourth embodiment is used as a BGA packaged IC socket as an example of a semiconductor device that uses the socket according to the fifth embodiment. FIG. 11 is a side view of a semiconductor device 130 illustrating the state thereof prior to application of a pressing force thereto (or the restored state thereof after application of the pressing force thereto) and a state of the semiconductor device 130 at the time of application of pressing force thereto. In the drawings, reference numeral 111 designates an elastomer, 116 designates a socket, 117 designates a metal terminal, 130 designates a semiconductor device, 131 designates a printed circuit board, 132 designates a BGA package (IC package), 133 designates a circuit conductor, 134 designates an aluminum pad, 135 designates solder, and 136 designates a BGA terminal solder ball.

The semiconductor device 130 has a structure in which one of the arm portions of the socket 116 is bonded by means of the solder 135 onto the circuit conductor 133 of the printed circuit board 131, and the other arm portion of the socket 116 is in abutting contact with the BGA terminal solder ball 136 of the BGA package 132. The socket 116 according to the present embodiment includes substantially the same components as those of the socket according to the fourth embodiment described above, except that the metal terminal 117 is not provided with the convex portion on an outer surface of the metal terminal.

In the semiconductor device 130 illustrated in the drawings, when the socket 116 is connected to the circuit conductor (terminal) 133 on the printed circuit board 131, paste solder is preliminarily applied at necessary locations of the printed circuit board 131, the socket 116 is mounted thereon with an outer surface of one of the arm portions being in contact with the printed circuit board, and the printed circuit board 131 is passed through a reflow furnace to be soldered to the socket 116 mounted thereon, so that they are electrically connected with each other. In this case, the elastomeric member 111 preferably has heat-resisting properties capable of enduring the reflow treatment temperature. Since fluorinated elastomers are available as a commercialized product capable of enduring the reflow treatment temperature, a fluorinated elastomer is preferably used.

The state where the socket 116 is mounted on the printed circuit board 131 and the BGA packaged IC 132 is placed thereon is illustrated in FIG. 11A. The state thereof at the time of application of a load thereto in such a state is illustrated in FIG. 11B. When a load is applied thereto, the elastomeric member 111 is compressed to be sunken while generating a repulsive force in response to the compression. The load and sinking relationship corresponds to load-stroke characteristics. Moreover, in such a case, since the arm portions are sunken about the main columnar portion, the contact point will be moved toward the main columnar portion when a load is applied thereto, and thus, a wiping effect is carried out. Accordingly, it is possible to remove an oxide film generated on the metal surfaces, so that connection can be realized with fresh metal surfaces, and to thus realize a low resistance electrical connection.

As described above, in accordance with the sockets 110 and 116 according to the present invention, it is possible to provide a large stroke with a low load at a low contact resistance even when either is used in a BGA package having a convex terminal portion or in an LGA package or a printed circuit board having a flat terminal land.

Furthermore, in accordance with the sockets 110 and 116 according to the present invention, a fixing portion of the metal terminal 114 having an angular U shape and a molded portion are integrally formed with the soft elastomeric member 111. Owing to such a configuration, even when substrate to be connected with the socket 110 or 116 has some degree of warpage, since the elastomeric member 111 might assume the warped shape, it is possible to provide the advantage of reducing the influence of the warpage of the substrate.

(Embodiment 6)

Figure 12:
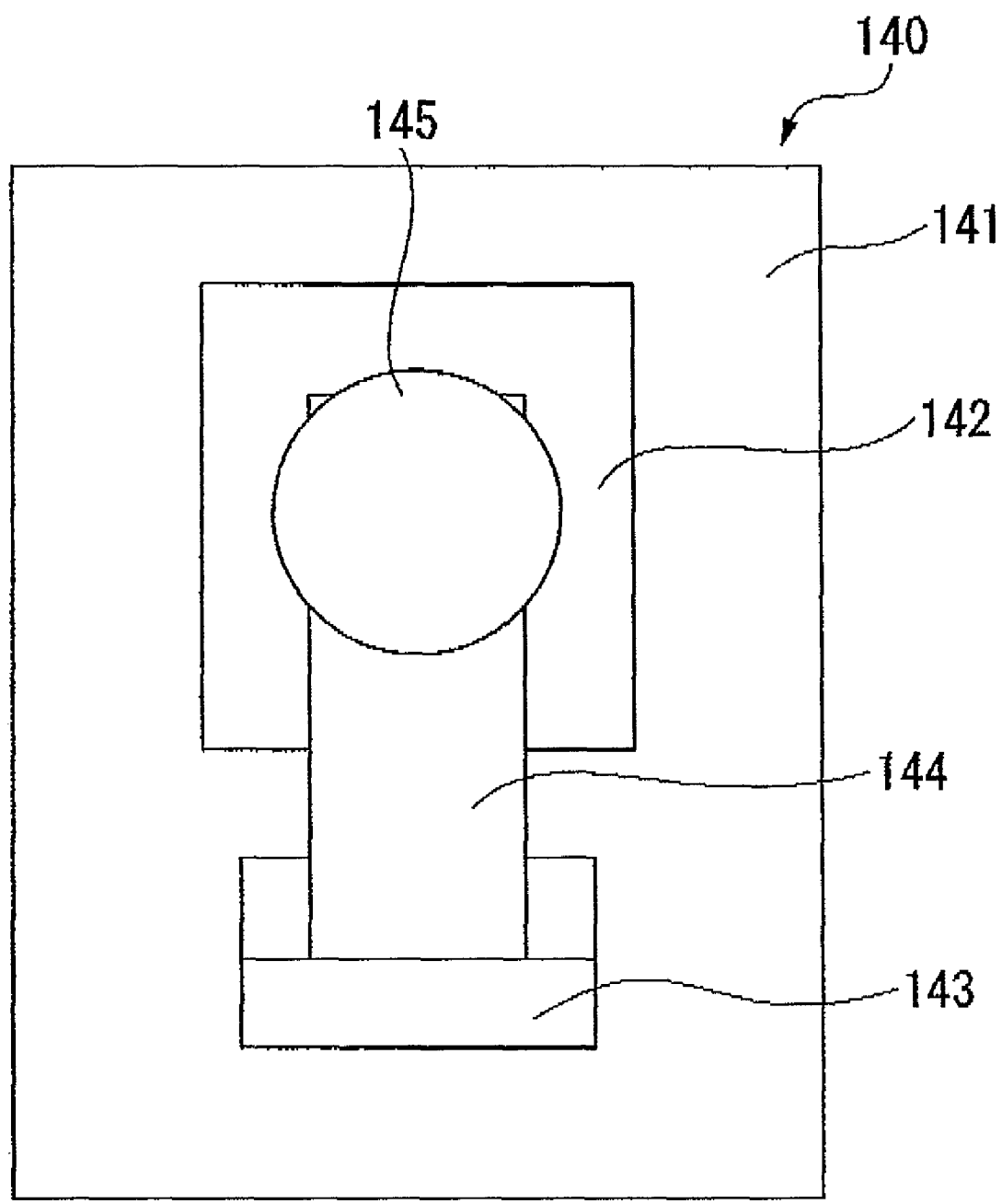
FIG. 12 is a top plan view of a socket according to a sixth embodiment of the present invention.

FIG. 12 is a top plan view of a socket according to a sixth embodiment of the present invention. In FIG. 12, reference numeral 140 designates a socket, 141 designates an elastomer, 142 designates a through-hole, 143 designates a terminal attachment through-hole, 144 designates a metal terminal, and 145 designates a convex portion.

Although the sockets 110 and 116 according to the fourth and fifth embodiments described above have the groove 112 being formed in the peripheral portion of the metal terminal, in the socket 140 according to the present embodiment, a through-hole 142 may be formed so as to penetrate through the elastomer 141, instead of providing the groove 112 formed in the peripheral portion of the metal terminal 114. By having such a structure, it is possible to obviate the need to pay attention to the depth-directional control of the groove 112 and to thus confirm whether or not it is optimally processed solely by an operator's sight. Even with such a structure, the socket has the same basic characteristics as those of the sockets 110 and 116 according to the first and second embodiments described above.

The socket of the present invention is preferably fabricated by the following fabrication method comprising the steps of:

(1) boring a terminal attachment through-hole in a portion of a peripheral border of a metal terminal forming position and preparing an elastomer having a groove or a through-hole formed in a peripheral portion of the metal terminal forming position and a metal terminal having an angular U shape; and (2) passing a portion of the metal terminal into the terminal attachment through-hole of the elastomer, and making the elastomer at the metal terminal forming position to be firmly held between arm portions on both sides of the metal terminal.

The metal terminal used in the socket fabrication method of the present invention can be easily fabricated using materials such as copper or brass by an existing metal part processing technique, e.g., by means of pressing or metal molding. Moreover, the plating treatment may use general nickel plating or gold plating techniques, and it is possible to cope with the fine pitch requirements within the range obtainable by such techniques.

Furthermore, the elastomer may be produced by a method of extruding a liquid raw material into a plate shape and cutting into a desired size or a method of realizing a desired shape by injection molding, and such methods are also available from an existing fabrication technique. Although it is preferable to form the groove or through-hole and the terminal attachment through-hole formed in the elastomer simultaneously with the forming of the elastomer into a plate shape, the groove and the through-hole may be formed after the elastomer has been formed into the plate shape.

In the socket fabrication method according to the present invention, the metal terminal serving as a metal terminal might not originally have an angular U shape, and a metallic member having a generally L shape or a straight-line shape may be inserted into an elastomeric member and subjected to folding processing to thereby form a metal terminal having an angular U shape. When such a metallic member is used, the socket is preferably fabricated by the following fabrication method comprising the steps (A) to (C):

(A) boring a terminal attachment through-hole in a portion of a peripheral border of a metal terminal forming position, and preparing an elastomeric member having a groove or a through-hole formed in a peripheral portion of the metal terminal forming position and a metallic member having a generally L shape or a straight-line shape; (B) fitting the metallic member into the terminal attachment through-hole of the elastomeric member; and (C) folding the metallic member at one end side or both end sides thereof to form a metal terminal having an angular U shape, and making the elastomeric member at the metal terminal forming position to be firmly held between arm portions on both sides of the metal terminal.

In accordance with the socket fabrication method of the present invention, it is possible to fabricate the sockets 110, 116 and 140 according to the present invention in a simple and efficient manner, and to thus fabricate a high-performance socket at a low cost.

An experiment was conducted using the socket having the structure illustrated in FIG. 8 as a socket for connecting the printed circuit board and the LGA package with each other as illustrated in FIG. 10.

A predetermined load was applied from the LGA package side to the semiconductor device illustrated in FIG. 10, and the displacement (mm) at that moment was measured. As a result of the experiment, it was confirmed that it is possible to satisfy displacement characteristics of 0.3 mm at a load of 50 gf as required in the field of IC sockets.

Moreover, electrical characteristics of the socket were examined by applying a voltage across the circuit conductor of the printed circuit board and the LGA land in the state illustrated in the right part of FIG. 10 and measuring the current flowing therethrough and the voltage applied thereto. The measurement results of the electrical characteristics are shown in Table 2.

TABLE 2

| Electrical Characteristics | Measurement Value | Note |
|---|---|---|
| Inductance (nH) | 0.8 | at 500 MHz |
| Resistance (mΩ) | 10 | at 50 gf |

From the above results, it can be concluded that it is possible to realize a socket having a low resistance and a low inductance by using the socket according to the present invention.

(Embodiment 7)

Figure 13:
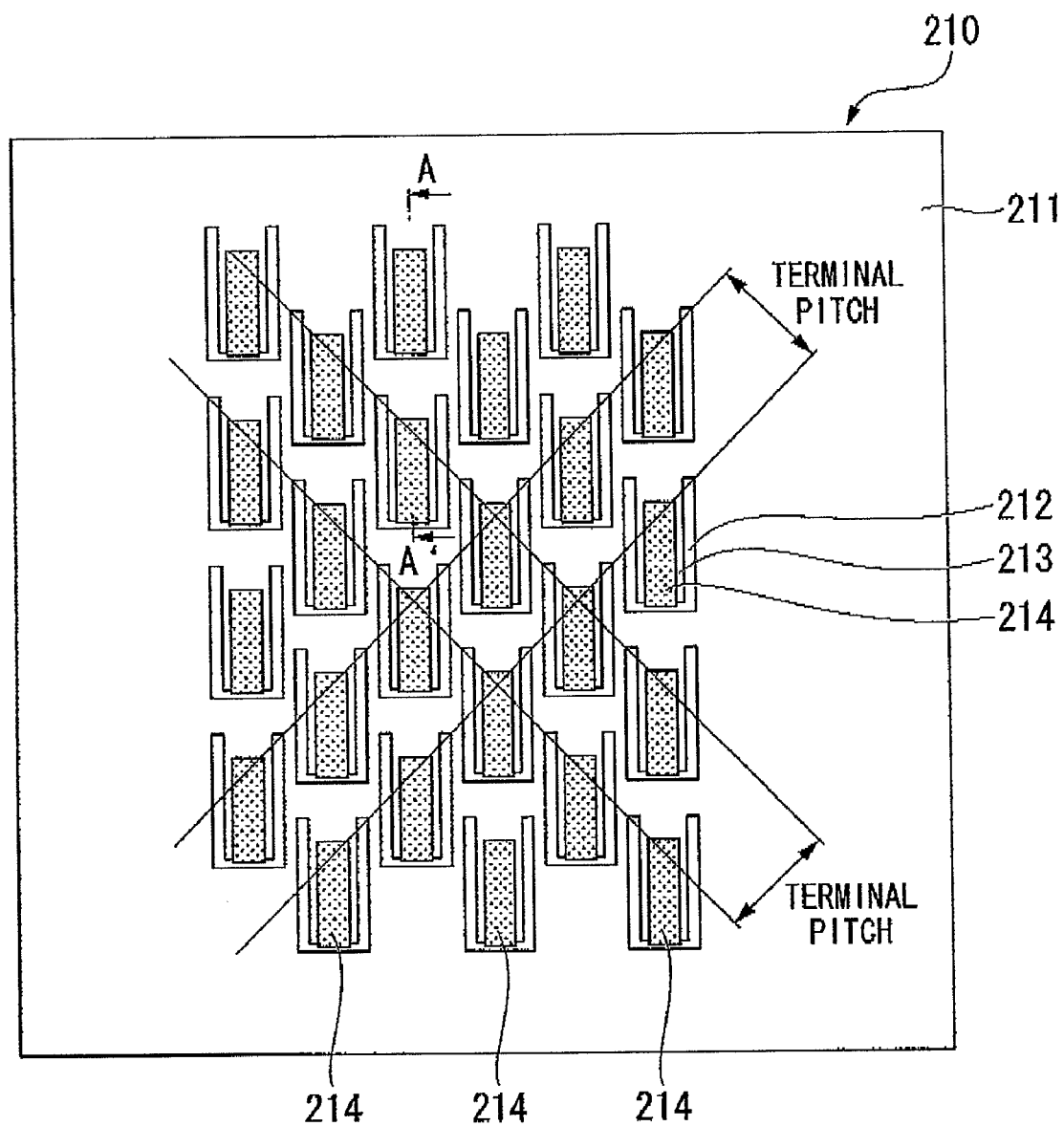
FIG. 13 is a top plan view of a socket according to a seventh embodiment of the present invention.
Figure 14:
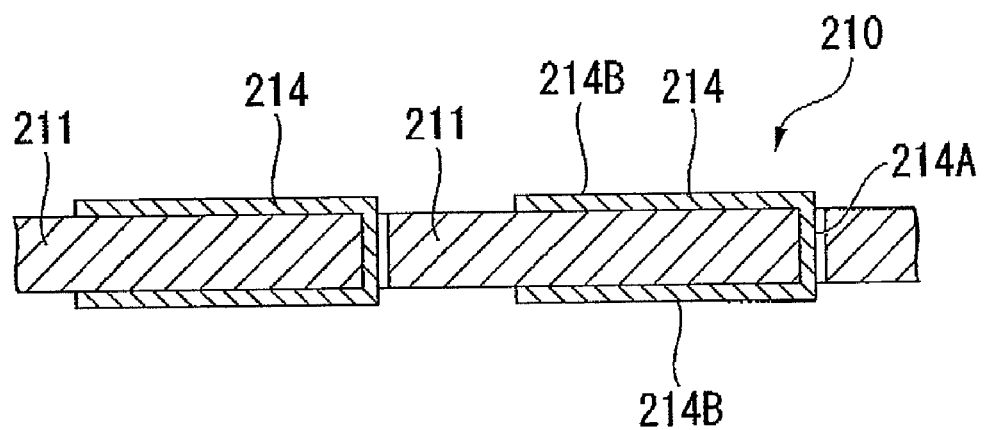
FIG. 14 is a cross-sectional view taken along the line A-A' in FIG. 13.

FIGS. 13 and 14 are views illustrating a socket according to a seventh embodiment of the present invention, in which FIG. 13 is a top plan view of a socket 210, and FIG. 14 is a cross-sectional view taken along the line A-A' in FIG. 13. In the drawings, reference numeral 210 designates a socket, 211 designates an elastomeric member, 212 designates a slit, 213 designates a tongue piece portion, 214 designates a metal terminal, 214A designates a main columnar portion, and 214B designates an arm portion.

The socket 210 according to the present embodiment includes a plate-like elastomeric member 211 having a slit 212 having an angular U shape formed in a peripheral border of a metal terminal arrangement region and a tongue piece portion 213 serving as the metal terminal arrangement region formed at an inner side of the slit 212; and a metal terminal 214 having an angular U shape including a main columnar portion 214A and arm portions 214B configured to extend from both ends of the main columnar portion 214A with the tongue piece portion 213 being firmly held between the arm portions 214B, in which the main columnar portion 214A of the metal terminal 214 is formed at a protrusive distal end portion of the tongue piece portion 213 and a terminal contact portion among the arm portions 214B is arranged in the vicinity of a proximal end portion of the tongue piece portion 213. In the example illustrated in the drawings, the configuration in which a plurality of metal terminals 214 is arranged on one sheet of the elastomeric member 211 in a triangular grid shape is shown.

The socket 210 according to the present embodiment has a socket terminal structure in which the metal terminal 214 having an angular U shape is used as a contact terminal for making contact with a terminal of a printed circuit board or an IC package, and a repulsive force thereof is secured by the tongue piece portion 213 of the elastomeric member 211 being firmly held in the metal terminal 214. The socket has a basic structure in which the slit 212 having an angular U shape is formed in the plate-like elastomeric member 211 so that the metal terminal 214 is attached to the slit 212, and at least a portion of the tongue piece portion 213 of each terminal is connected with an elastomer support plate (a body portion of the elastomeric member 211 except the tongue piece portion 213) for connecting terminals with each other, so that it is possible to make the tongue piece portion 213 to be firmly held in the metal terminal 214 having an angular U shape in a state where the tongue piece portion 213 is raised and deformed.

By having such a structure, the socket 210 according to the present embodiment can make metallic contact with the terminal of the printed circuit board or the package. Moreover, it is possible to realize a socket structure capable of providing the load-stroke characteristics mainly caused by the repulsive force of an elastomer in an easy-to-assemble shape.

Moreover, since the arm portions 214B being the contact portion are sunken about both ends of the main columnar portion 214A, it is possible to realize the wiping effect.

Furthermore, since a current flows through the metal terminal 214 having an angular U shape, it is possible to realize a low inductance connection by decreasing the electrical conduction path. Therefore, the socket 210 according to the present embodiment can become a high-performance socket capable of coping with low resistance, large current and fast operation speed requirements.

Furthermore, by having such a structure, since the tongue piece portion 213 for providing a repulsive force being firmly held by the metal terminal 214 having an angular U shape and a positioning support plate for connecting terminals with each other can be formed by the same plate-like elastomeric member 211, it is possible to fabricate the socket by merely forming the slit 212 in the elastomeric member 211 and sandwiching the metal terminal 214 having an angular U shape into the tongue piece portion 213 inside the slit 212.

Although in the present embodiment, the slit 212 formed in the elastomeric member 211 has an angular U shape, as long as the elastomer support plate for connecting the terminals with each other is connected to at least a portion of the tongue piece portion 213 of each terminal, the shape of the slit is not limited to an angular U shape, but the slit may have a curved U shape or other shapes.

Since the connection portion of the elastomeric member 211 and the tongue piece portion 213 has influence on the load-displacement characteristics at the time of application of a load, when it is desired to design the load-displacement characteristics by calculating the repulsive force with an assumption that the tongue piece portion 213 is an ideal rectangular solid, it is better to have a thinner connection portion as long as it can endure mechanical strength or repeated load application. For this reason, as the shape of the connection portion, a slit shape wherein the connection portion is intentionally made small like a C shape, or a shape wherein a portion of the connection portion is further incised may be considered. However, when the stability of the metal terminal having an angular U shape is considered, it is necessary for the main columnar portion 214A of the metal terminal 214 to collide with the surface of the tongue piece portion 213 to thereby suppress misalignment of the metal terminal 214, thereby maintaining its alignment. Therefore, it is desirable that the metal terminal 214 and the tongue piece portion 213 have a contact surface so that they make three- or more point contact with each other. Moreover, in FIG. 13, the main columnar portion 214A of the metal terminal 214 having an angular U shape and the tongue piece portion 213 make a straight-line surface contact with each other.

The metal terminal 214 having an angular U shape as illustrated in FIGS. 13 and 14 is preferably formed of materials having high conductive properties such as copper or brass, and it is preferable to apply gold plating to an outer surface thereof in order to decrease contact resistance. In the case of applying gold plating to copper, nickel plating is usually applied to an underlying layer as a diffusion blocking layer.

The height of the elastomeric member 211 including the tongue piece portion 213 firmly held in the metal terminal 214 is preferably equal to an inside height dimension of the metal terminal 214. Moreover, when the slit width between the tongue piece portion 213 and a neighboring elastomeric member 211 is too narrow, the tongue piece portion 213 pressed at the time of application of a load to the metal terminal 214 may interfere with the body portion of the opposing elastomeric member 211 with the slit 212 disposed therebetween, and thus, the load necessary for obtaining a predetermined displacement amount is increased. Moreover, it becomes difficult to obtain the advantage of diminishing transmission of a force generated by the extension and compression of the elastomer to the neighboring metal terminals 214. On the other hand, when the width of the slit 212 provided on the peripheral portion of the tongue piece portion 213 is too large, it is difficult to decrease an inter-terminal gap or secure a sufficient volume of the tongue piece portion 213, and thus, it becomes difficult to obtain a sufficient repulsive force of the tongue piece portion 213.

By the reasons described above, it is preferable that the size of the tongue piece portion 213 firmly held in the metal terminal 214 is equal to or slightly larger than the area of the metal terminal 214. In other words, by adjusting the dimension of the tongue piece portion 213, it is possible to control the load-displacement characteristics of each terminal.

Figure 15:
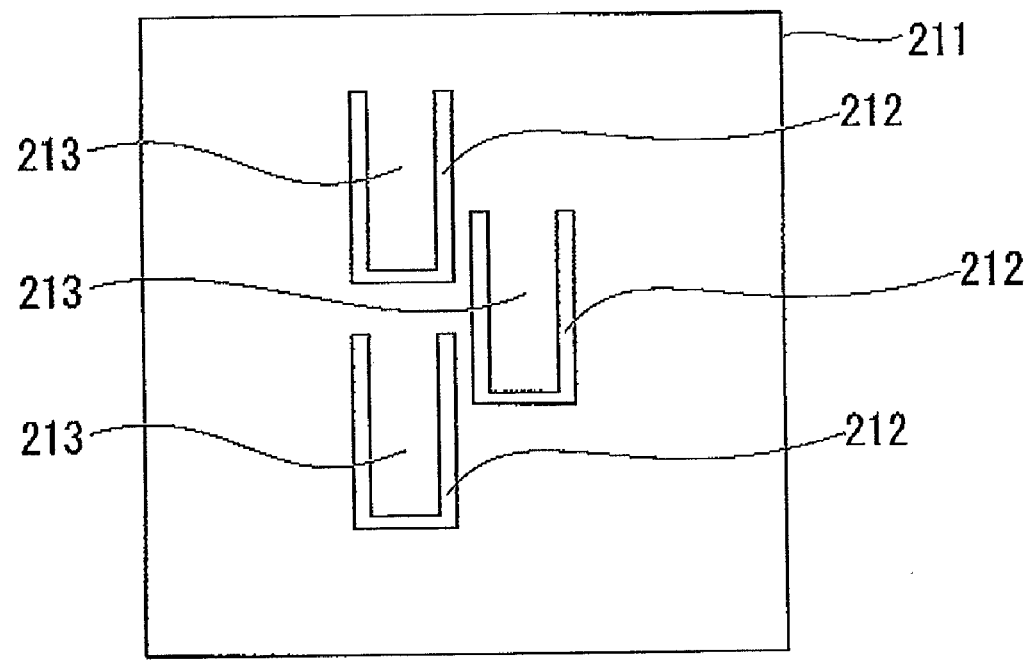
FIG. 15 is a top plan view illustrating a state where a slit is formed in a plate-like elastomer, showing an example of a socket fabrication method according to the present invention.

Next, a description of an example of a method of fabricating the socket 210 according to the present embodiment will be provided with reference to FIGS. 15 and 16. FIG. 15 is a top plan view illustrating a state where a slit 212 having an angular U shape is formed at a predetermined position of a plate-like elastomeric member 211 used for fabricating the socket 210, and FIG. 16 is a side cross-sectional view showing the fabrication method of the socket 210 according to the present embodiment, in order of its fabrication process steps.

The method of fabricating the socket 210 according to the present embodiment includes the steps of: preparing plate-like elastomeric member 211 having a slit 212 having an angular U shape or a generally U shape formed in a peripheral border of a metal terminal arrangement region and a tongue piece portion 213 serving as the metal terminal arrangement region formed at an inner side of the slit 212 and a metal terminal 214 having an angular U shape; upwardly pressing or downwardly pulling the tongue piece portion 213 of the elastomeric member 211 so as to be projected from a front surface or a back surface of the elastomer and leaving it in this state; attaching the metal terminal 214 to the tongue piece portion 213 projected from the front surface or the back surface of the elastomeric member so that the tongue piece portion 213 is firmly held between arm portions of the metal terminal; and making the tongue piece portion 213 having the metal terminal 214 attached thereto to be received in the slit 212, thereby obtaining the socket 210.

The metal terminal 214 used in the socket fabrication method of the present invention can be easily fabricated using materials such as copper or brass by an existing metal part processing technique, e.g., by means of pressing or metal molding. Moreover, the plating treatment may use general nickel plating or gold plating techniques, and it is possible to cope with the fine pitch requirements within the range obtainable by such techniques.

Furthermore, the elastomeric member 211 may be produced by a method of extruding a liquid raw material into a plate shape and cutting into a desired size or a method of realizing a desired shape by injection molding, and such methods are also available from an existing fabrication technique. The slit 212 formed in the elastomeric member 211 can be easily formed by applying, e.g., punching processing, to the plate-like elastomeric member 211.

Figure 16A:
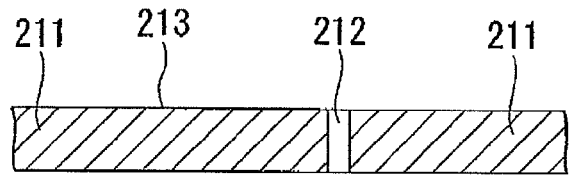
FIG. 16 is a side cross-sectional view showing an example of the socket fabrication method according to the present invention, in order of its fabrication process steps.

The elastomeric member 211 having formed therein the slit 212 is illustrated in FIGS. 15 and 16A. As illustrated in FIG. 15, by forming the slit 212 having an angular U shape in the elastomeric member 211, the tongue piece portion 213 serving as the metal terminal arrangement region is formed at an inner side of the slit 212.

Figure 16B:
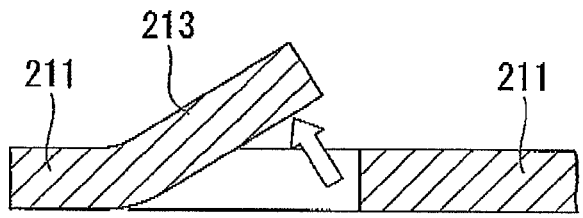

Next, as illustrated in FIG. 16B, the tongue piece portion 213 is pressed upwardly so as to be projected above the elastomeric member 211.

Figure 16C:
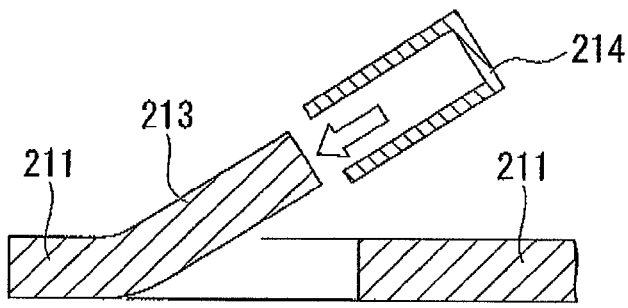

Next, as illustrated in FIG. 16C, a separately prepared metal terminal 214 is fitted into the tongue piece portion 213 so that the tongue piece portion 213 is firmly held between both arm portions.

Figure 16D:
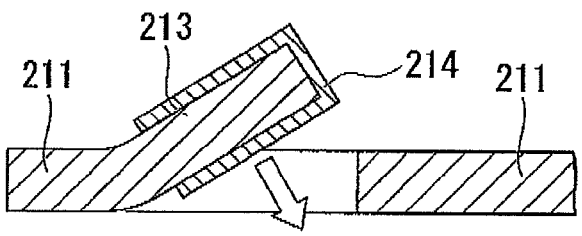
Figure 16E:
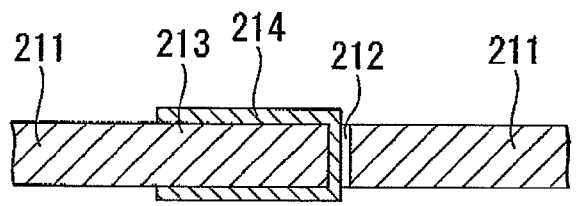

Next, as illustrated in FIGS. 16D and 16E, the tongue piece portion 213 having the metal terminal 214 attached thereto is received into the slit 212, thereby obtaining the socket 210.

In the socket fabrication method according to the present invention, the metal terminal serving as a metal terminal might not originally have an angular U shape, and a metallic member having a generally L shape or a straight-line shape may be inserted into the slit 212 and subjected to folding processing to thereby form a metal terminal having an angular U shape. When such a metallic member is used, the socket is preferably fabricated by the following fabrication method comprising the steps (1) to (3):

(1) preparing a plate-like elastomeric member 211 having a slit 212 having an angular U shape or a generally U shape formed in a peripheral border of a metal terminal arrangement region and a tongue piece portion 213 serving as the metal terminal arrangement region formed at an inner side of the slit 212 and a metallic member having a generally L shape or a straight-line shape; (2) fitting the metallic member into the elastomeric member 211 through the slit 212; and (3) folding the metallic member at one end side or both end sides thereof to form a metal terminal 214 having an angular U shape and making the tongue piece portion 213 to be firmly held between arm portions on both sides of the metal terminal 214.

Figure 17A:
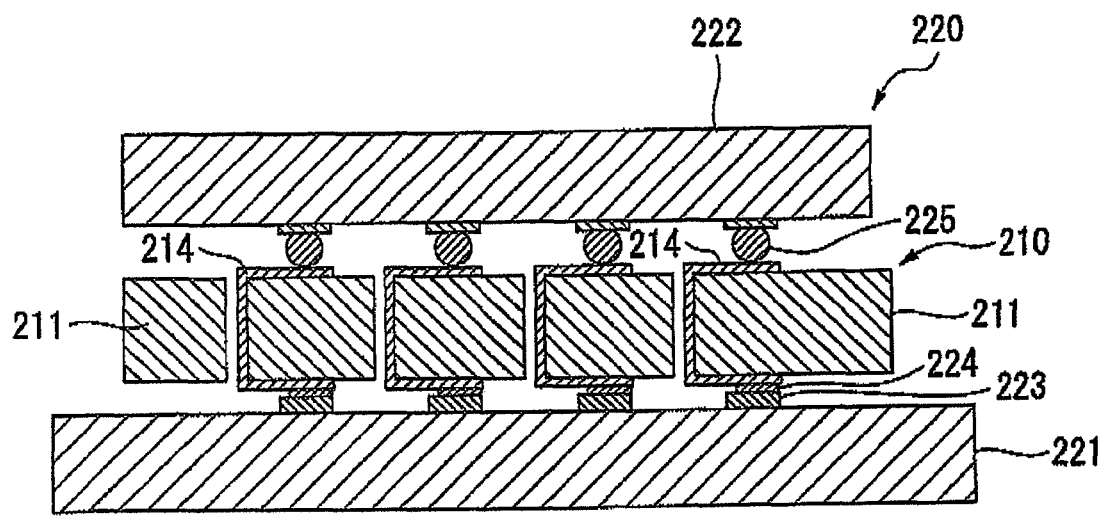
FIG. 17A is a side cross-sectional view of a semiconductor device illustrating a state thereof prior to application of a pressing force thereto (or a restored state thereof after application of pressing force thereto), illustrating a contact operation when the socket according to the seventh embodiment is used as a BGA packaged IC socket as an example of a semiconductor device that uses the socket according to the seventh embodiment.
Figure 17B:
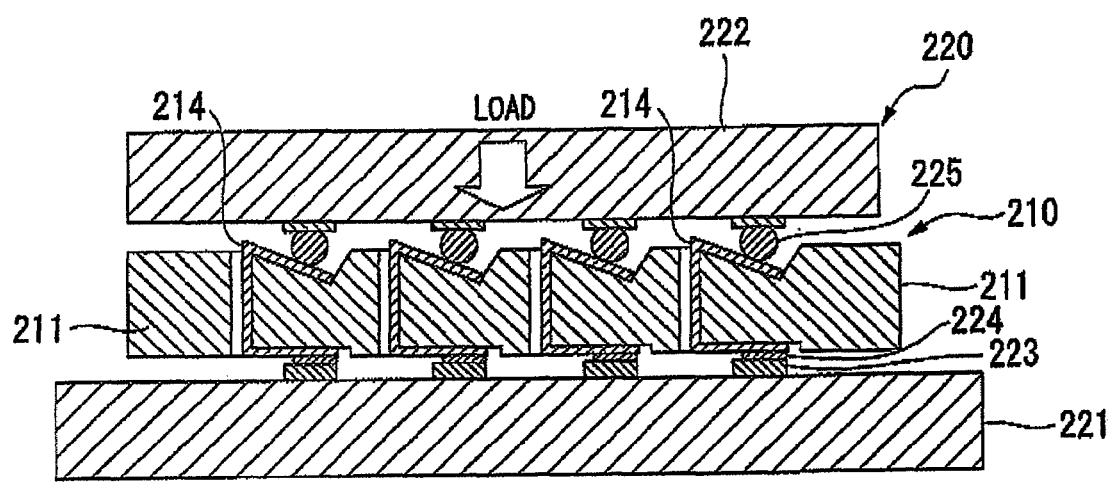
FIG. 17B is a side cross-sectional view of the semiconductor device, illustrating a state thereof at the time of application of pressing force.

FIG. 17 is a view illustrating a contact operation when the socket 210 according to the present embodiment is used as a BGA packaged IC socket as an example of a semiconductor device that uses the socket 210 according to the present embodiment. FIG. 17A is a side cross-sectional view of a semiconductor device 220 illustrating the state thereof prior to application of a pressing force thereto (or the restored state thereof after application of the pressing force thereto), and FIG. 17B is a side cross-sectional view of the semiconductor device 220, illustrating the state thereof at the time of application of the pressing force. In the drawings, reference numeral 220 is a semiconductor device, 221 is a printed circuit board, 222 is a BGA package (IC package), 223 is a pattern wiring, 224 is solder, and 225 is a BGA terminal solder ball.

When the socket 210 is connected to the pattern wiring 223 on the printed circuit board 221, paste solder 224 is preliminarily applied at necessary locations of the printed circuit board 221, the socket 210 is mounted thereon with an outer surface of one of the arm portions being in contact with the printed circuit board, and the printed circuit board 221 is passed through a reflow furnace to be soldered to the socket 210 mounted thereon, so that they are electrically connected with each other.

In the semiconductor device, the state where the socket 210 is mounted on the printed circuit board 221 and the BOA packaged IC 222 is placed thereon is illustrated in FIG. 17A. The state thereof at the time of application of a load thereto in such a state is illustrated in FIG. 17B. When a load is applied thereto, the elastomeric member 211 is compressed to be sunken while generating a repulsive force in response to the compression. The load and sinking relationship corresponds to load-stroke characteristics. Moreover, in such a case, since the arm portions are sunken about the main columnar portion, the contact point will be moved toward the main columnar portion when a load is applied thereto, and thus, a wiping effect is carried out. Accordingly, it is possible to remove an oxide film generated on the metal surfaces, so that connection can be realized with fresh metal surfaces, and to thus realize a low resistance electrical connection.

As a matter of course, the load-displacement characteristics of the socket according to the present invention are mainly determined by the characteristics of the elastomer of the tongue piece portion 213. Therefore, it is necessary to select an appropriate elastomer material depending on the load-displacement requirements required as a socket, and in addition to this, the elastomeric member 211 as illustrated in FIGS. 17A and 17B may need to have soldering-resisting properties. In this case, heat-resisting properties are important. Among elastomer materials available on the market, examples of elastomer materials having excellent heat-resisting properties and capable of realizing the socket's load-displacement characteristics include fluorinated elastomers, propylene elastomers, ethylene elastomers, and polyester elastomers. Among these elastomer materials, fluorinated elastomers are particularly preferable.

(Embodiment 8)

Figure 18:
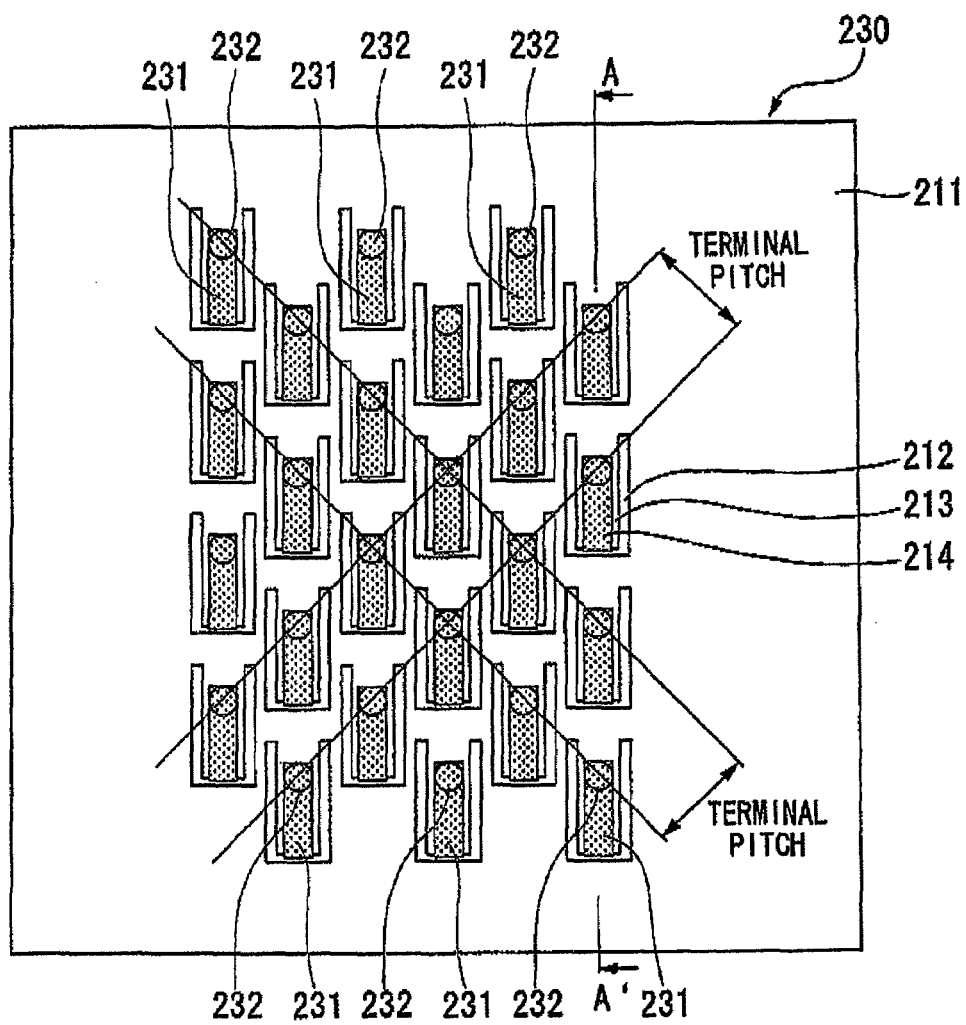
FIG. 18 is a top plan view of a socket according to an eighth embodiment of the present invention.
Figure 19:
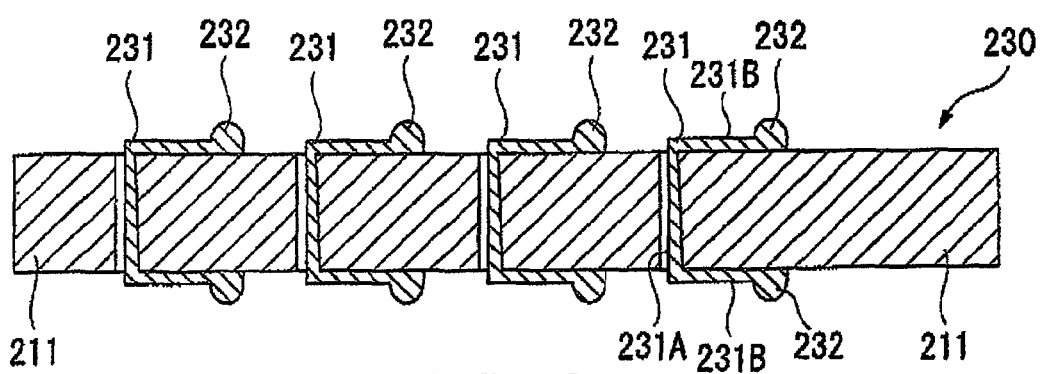
FIG. 19 is a cross-sectional view taken along the line A-A' in FIG. 18.

FIGS. 18 and 19 are views illustrating a socket according to an eighth embodiment of the present invention, in which FIG. 18 is a top plan view of a socket 230 according to the present embodiment, and FIG. 19 is a cross-sectional view taken along the line A-A' in FIG. 18. In the drawings, reference numeral 211 designates an elastomeric member, 212 designates a slit, 213 designates a tongue piece portion, 230 designates a socket, 231 designates a metal terminal, 231A designates a main columnar portion, 231B designates an arm portion, and 232 designates a convex portion.

The socket 230 according to the present embodiment includes substantially the same components as those of the socket 210 according to the seventh embodiment described above. Moreover, the socket 230 has the same basic structure as the socket 210 in that the slit 212 having an angular U shape is formed in the elastomeric member 211 so that the metal terminal is attached to the slit 212, and at least a portion of the tongue piece portion 213 of each terminal is connected with an elastomer support plate for connecting terminals with each other, so that it is possible to make the tongue piece portion 213 to be firmly held in the metal terminal in a state where the tongue piece portion 213 is raised and deformed. However, the present embodiment differs from the seventh embodiment in that the metal terminal 231 used in the present embodiment has a convex portion 232 having a dome shape or a semi-cylindrical shape formed on an outer surface of the arm portion 231B so that the LGA package can be mounted thereon.

Moreover, a semiconductor device (see FIGS. 20A and 20B) using the socket 230 is assumed to have a structure in which a convex portion is also provided on a printed circuit board side so as to make contact with a connection land formed on the printed circuit board. In the socket market, sockets used by being mounted on a printed circuit board of a real apparatus or device include one used in a personal computer, which is not replaced after having been mounted therein and one used in a server device, in which socket contacts are periodically replaced. The socket 230 illustrated in FIGS. 18 and 19 has a structure having a metallic contact on both surfaces thereof in order to be used for such a server device. In this way, the socket according to the present invention can be applied to an LGA package having no convex portion on an IC package and to such a server device in which the socket contacts are replaced at the time of maintenance.

Figure 20A:
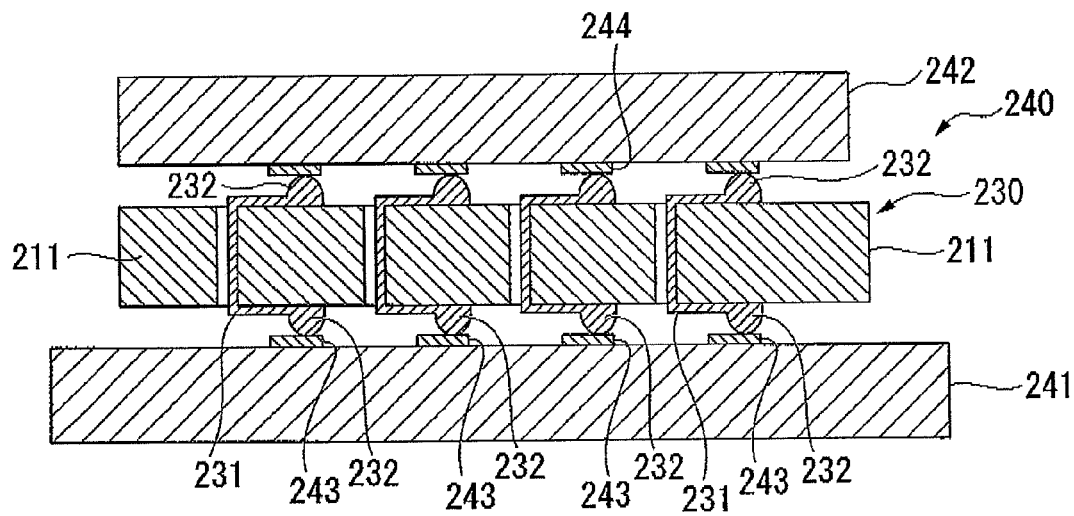
FIG. 20A is a side cross-sectional view of a semiconductor device illustrating a state thereof prior to application of a pressing force thereto (or a restored state thereof after application of the pressing force thereto), illustrating a contact operation when the socket according to the eighth embodiment is used as an LGA packaged IC socket as an example of a semiconductor device that uses the socket according to the eighth embodiment.
Figure 20B:
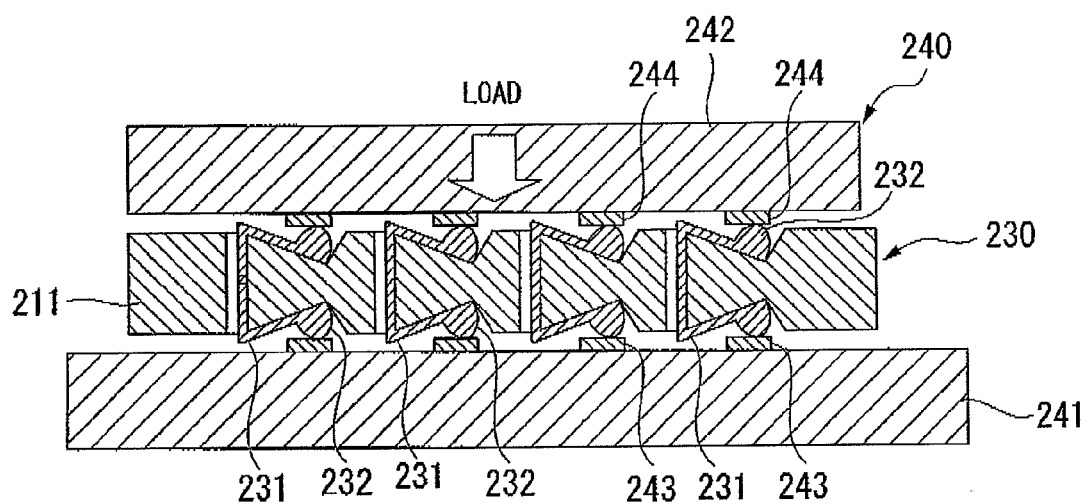
FIG. 20B is a side cross-sectional view of the semiconductor device, illustrating a state thereof at the time of application of the pressing force.

FIGS. 20A and 20B are views illustrating an operation when the socket 230 according to the present embodiment is used as a LGA package IC socket as an example of a semiconductor device that uses the socket 230 according to the present embodiment.

FIG. 20A is a side cross-sectional view of a semiconductor device 240 illustrating the state thereof prior to application of the pressing force thereto (or the restored state thereof after application of the pressing force thereto), and FIG. 20B is a side cross-sectional view of the semiconductor device 240, illustrating the state thereof at the time of application of the pressing force. In the drawing figures, reference numeral 240 designates a semiconductor device, 241 designates a printed circuit board, 242 designates an LGA package (IC package), 243 designates pattern wiring, and 244 designates an LGA land.

The semiconductor device 240 has a structure in which one of the arm portions of the socket 230 is placed on the pattern wiring 243 of the printed circuit board 241 and the other arm portion of the socket 230 is in abutting contact with the LGA land 244 of the LGA package 242. The socket 230 according to the present embodiment has a structure in which the convex portions 232 are provided on the metal terminal 231 having an angular U shape so that a stroke can be produced by the height of the convex portions 232.

The state thereof at the time of application of a load thereto in such a state is illustrated in FIG. 20B. When a load is applied thereto, the elastomeric member 211 is compressed to be sunken while generating a repulsive force in response to the compression. The load and sinking relationship corresponds to load-stroke characteristics. Moreover, since the arm portions of the metal terminal 231 are sunken about a portion thereof being joined with the main columnar portion, the contact point will be moved toward the main columnar portion when a load is applied thereto, and thus, a wiping effect is carried out. Accordingly, it is possible to remove an oxide film, so that connection can be realized with fresh metal surfaces, and to thus realize a low resistance electrical connection. Furthermore, as a matter of course, the height or width dimension of the elastomeric member 211 needs to be designed to have repulsive properties capable of satisfying necessary load-stroke characteristics, and it is particularly necessary to design the height dimension of the elastomeric member 211 to a size at least larger by the amount of stroke.

In this case, this socket structure is different from that illustrated in FIGS. 17A and 17B, in that the elastomeric member 211 is compressed on both upper and lower sides thereof. Moreover, when the thickness of a land to be connected thereto is not considered, the displaceable range (stroke) of the socket structure illustrated in FIGS. 20A and 20B is determined by the height of the convex portion 232. Therefore, as long as it is possible to form the convex portion 232 that does not deform upon application of compressive force thereto, it is possible to increase the displacement by increasing the height of the convex portion 232. In general, sockets are often required to provide a displacement of about 0.1 to 1.0 mm at a load of about 10 to 50 gf, and the socket 230 according to the present embodiment is capable of coping with such requirements.

According to a simulation conducted on the socket structure illustrated in FIGS. 20A and 20B, it was confirmed that a displacement of 0.15 mm was obtained at a load of about 25 gf with a maximum displacement of about 0.3 mm, and a low inductance of 1 nH or less was realized at a frequency of 500 MHz.

(Embodiment 9)

Figures 21A, 21B:
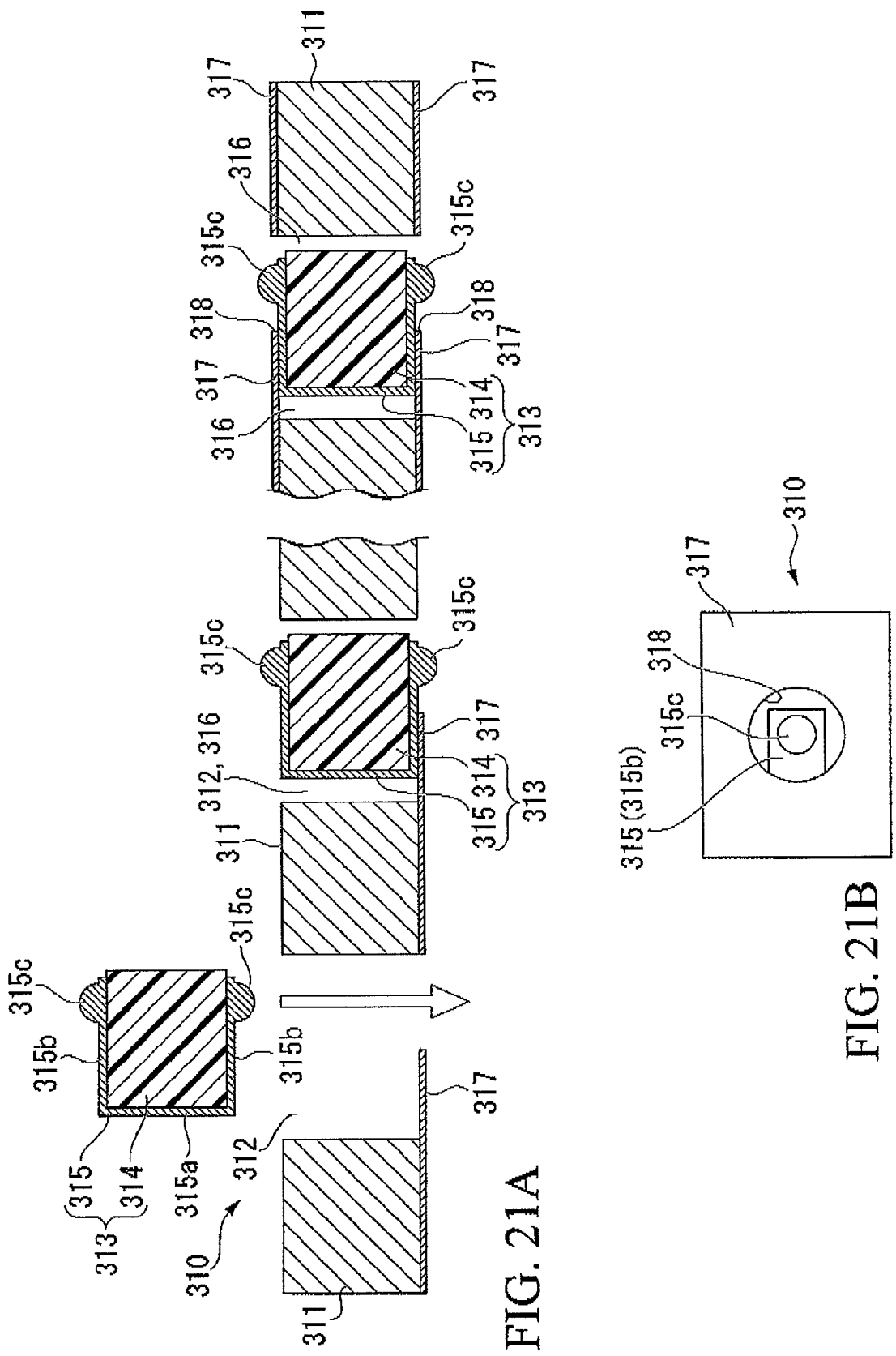
FIG. 21A is a side cross-sectional view of a socket according to a ninth embodiment of the present invention.
FIG. 21B is a top plan view of a main part thereof.

FIGS. 21A and 21B illustrate a socket according to a ninth embodiment of the present invention. FIG. 21A is a side cross-sectional view illustrating an assembled state of a socket 310, and FIG. 21B is a top plan view of a main part of the socket 310. In the drawings, reference numeral 310 designates a socket, 311 designates a housing, 312 designates a terminal insertion hole, 313 designates a contact terminal, 314 designates an elastomeric member, 315 designates a metal terminal, 315$a$ designates a main columnar portion, 315$b$ designates an arm portion, 315$c$ designates a convex portion, 316 designates a gap, 317 designates a sheet, and 318 designates an opening portion.

The socket 310 according to the present embodiment includes a contact terminal 313, including: a metal terminal 315 having an angular U shape having a main columnar portion 315$a$ and arm portions 315$b$ configured to extend from both ends of the main columnar portion 315$a$; and an elastomeric member 314 firmly held between the arm portions 315$b$ on both sides; and a housing 311 having formed therein a terminal insertion hole 312 through which the contact terminal 313 is inserted, in which the terminal insertion hole 312 has a hole dimension larger than the contact terminal 313, and in which a sheet 317 having formed therein openings 318 for exposing portions of the arm portions 315$b$ is fixed on both a front surface and a back surface of the housing 311 so as to be in contact with the contact terminal 313 in a state where the contact terminal 313 is inserted into the terminal insertion hole 312. A convex portion 315$c$ is provided on an outer surface of each of the arm portions 315$b$ of the metal terminal 315 so as to be in contact with a terminal portion of a substrate or an IC package.

The metal terminal 315 having an angular U shape used in the socket 310 according to the present embodiment is suitably formed of materials having good conductive properties such as copper or brass, and it is preferable to apply gold plating to an outer surface thereof in order to decrease contact resistance. In the case of applying gold plating to copper, nickel plating is usually applied to an underlying layer as a diffusion blocking layer.

Moreover, a material of the elastomeric member 314 is appropriately selected from a variety of types of elastomer materials capable of appropriately exhibiting an elastic repulsive force upon application of a load to the arm portions 315$b$, and a fluorinated elastomer is preferably used when heat-resisting properties are required. The height of the elastomeric member 314 firmly held in the metal terminal 315 having an angular U shape is preferably equal to an inside height dimension of the metal terminal 315.

The housing 311 used for the socket 310 according to the present embodiment may be formed of a synthetic resin or the like. The terminal insertion hole 312 formed in the housing 311 may be formed simultaneously with the forming of the housing 311. Alternatively, a housing with no hole formed therein may be formed first, and then terminal insertion holes 312 having a desired dimension may be formed, e.g., by drilling, at predetermined pitches by means of punching.

The sheet 317 used for the socket 310 according to the present embodiment may be formed of a resin sheet made of a polyimide resin. The opening 318 provided in the sheet 317 is preferably designed to have an opening size capable of exposing a portion of the arm portion 315b of the metal terminal 315, particularly, the convex portion 315c and the periphery thereof.

The socket 310 according to the present embodiment has a socket terminal structure in which the metal terminal 315 having an angular U shape is used as the contact terminal 313 and in which a repulsive force thereof is secured by the elastomeric member 314 firmly held by the metal terminal 315. The socket 310 is characterized in that the contact terminal 313 is inserted through the terminal insertion hole 312 of the housing 311 while forming the gap 316 therebetween and the contact terminal is firmly held by the sheet 317 having the opening 318 on both upper and lower sides thereof, so that a number of contact terminals having appropriate load-stroke characteristics can be arranged in a housing, and thus, the assembling properties of the socket 310 is improved.

In the conventional socket having a plate spring structure as disclosed in Patent Documents 1 and 2, for example, metal terminals having a plate spring function are press-fitted into a housing formed of an insulating resin. Moreover, a beam part for the press-fit is provided in the terminal, and the beam part is designed to a dimension slightly larger than an insertion portion of the housing, so that a predetermined holding force can be secured. However, since the metal contact has become smaller and finer with the trend toward a finer pitch, it is difficult for the metal contact to be inserted into the housing, and the contact portion may be deformed when it is assembled in a press-fit manner, thus complicating the assembly process.

On the other hand, in the socket 310 according to the present embodiment, a hole dimension of the terminal insertion hole 312 of the housing 311 is designed to be sufficiently larger than the contact terminal 313, and the sheet 317 mainly opened at the contact portion is provided on bottom and top surfaces of the contact terminal so that the contact terminal 313 is firmly held by the sheet 317 on both front and back surfaces, thereby improving the assembling properties.

In the case of the socket 310 according to the present embodiment, in order to make it easy to assemble the contact terminal 313 into the housing 311, the hole of the housing 311 itself is opened larger than the terminal and is designed to such a dimension that the contact terminal 313 can be inserted therein when it is dropped with the position thereof being aligned to some extent while preventing it from easily falling over.

When the socket 310 according to the present embodiment is fabricated, first, the housing 311 having formed therein the terminal insertion hole 312 and the contact terminal 313 are prepared. Next, the contact terminal 313 is inserted into each terminal insertion hole 312. In this case, the sheet 317 opened at the terminal portion is preliminarily fixed on a lower surface side of the housing 311, so that the contact terminal 313 is prevented from falling off at the time of insertion thereof.

When the entirety of the contact terminals 313 have been inserted into the terminal insertion holes 312 of the housing 311, the upper sheet 317 is placed thereon and fixed to the housing 311, thereby obtaining the socket 310.

Herein, since the size of the terminal insertion hole 312 of the housing 311 is larger than the dimension of the contact terminal 313 including the elastomeric member 314, and the gap 316 is formed between the inner wall of the terminal insertion hole 312 and the contact terminal 313, it is possible to diminish the influence of a frictional force generated between the housing 311 and the elastomeric member 314 on the load-stroke characteristics of the contact terminal 313. Therefore, the contact terminal is able to exhibit the load-stroke characteristics of the elastomeric member 314.

Moreover, since the frictional force is small, it is possible to provide the advantage that the load-stroke characteristics might not change with a change in a load. In the present embodiment, however, it is necessary to use a thin material capable of satisfying necessary strength requirements as the sheet 317. This is because the thickness of the sheet 317 may become the cause of a decrease in an available stroke range. The available stroke range corresponds to the value obtained by subtracting the thickness of the sheet 317 from the height of the convex portion 315c of the contact terminal 313.

The socket 310 according to the present embodiment is particularly suitable for constructing a semiconductor device (not shown) in which a substrate such as a printed circuit board and an IC package such as an LGA package are connected with each other through the intervention of the socket 310. A BGA package may be used as the IC package instead of the LGA package, and in such a case, it is preferable to use a socket having no convex portion 315c formed on the contact terminal 313.

(Embodiment 10)

Figure 22A:
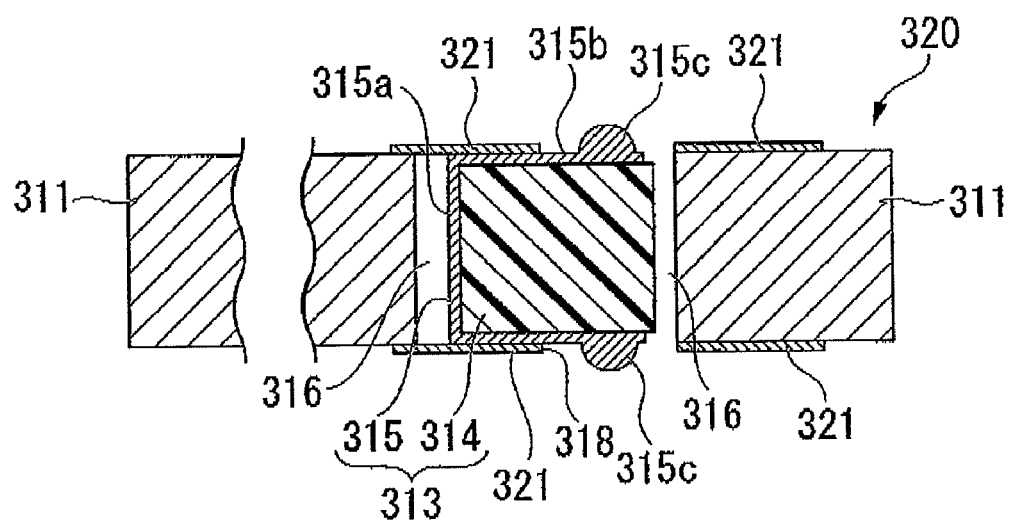
FIG. 22A is a side cross-sectional view of a socket according to a tenth embodiment of the present invention.
Figure 22B:
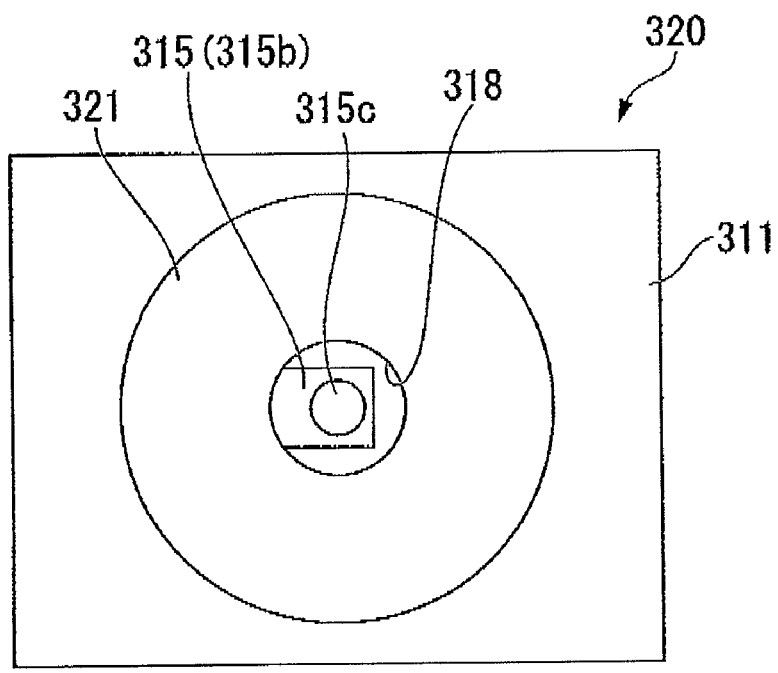
FIG. 22B is a top plan view of a main part thereof.

FIGS. 22A and 22B illustrate a socket according to a tenth embodiment of the present invention. FIG. 22A is a side cross-sectional view of a socket 320 according to the present embodiment, and FIG. 22B is a top plan view of a main part of the socket 320.

The socket 320 according to the present embodiment has substantially the same components as those of the socket 310 according to the ninth embodiment described above, and the same components are denoted by the same reference numerals. The socket 320 according to the present embodiment is different from the socket 310 according to the ninth embodiment, in that a metallic sheet 321 is used in the present embodiment.

As described above, in order to increase the stroke of the contact terminal 313, it is necessary to use a thin material as the sheet 321, while the sheet 321 needs to have strength in order to prevent dropping of the contact terminal. Moreover, the sheet is preferably less deformed by heat since heat is applied when the socket 320 is mounted on a substrate. Here, when a metal material such as SUS is used as the sheet 321, it is possible to satisfy the requirements including small thickness, dropping prevention, and less heat deformation. However, since it is electrically conductive, when it is processed in the form of a piece of sheet, the terminals may be short-circuited and might not be able to function as a socket.

Therefore, when a conductive metal is used as a material of the sheet 321, by using the sheet 321 configured to be independent for each contact terminal 313, it is possible to hold the contact terminals 313 while preventing them from being electrically short-circuited.

(Embodiment 11)

Figure 23:
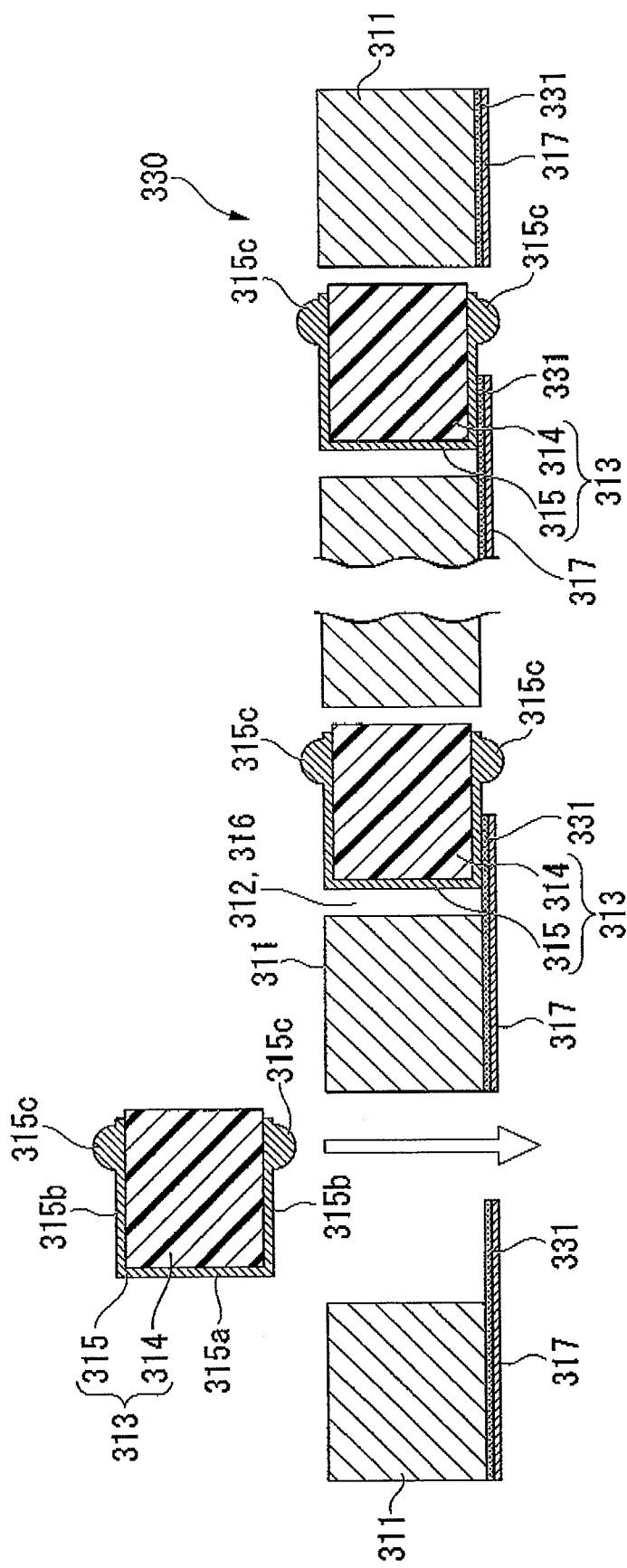
FIG. 23 is a side cross-sectional view of a socket according to an eleventh embodiment of the present invention.

FIG. 23 is a side cross-sectional view illustrating a socket according to an eleventh embodiment of the present invention.

The socket 330 according to the present embodiment includes substantially the same components as those of the socket 310 according to the ninth embodiment described above, and the same components are denoted by the same reference numerals. The socket 330 according to the present embodiment is different from the socket 310 according to the first embodiment, in that a sheet 317 having a bonding layer 331 provided on a lower surface side of the housing 311 is used, and the contact terminal 313 is bonded to the bonding layer 331 and held in the terminal insertion hole 312.

Since the socket 330 according to the present embodiment has the sheet 317 provided only on a single surface, the number of components of the socket is decreased, and thus, it is possible to fabricate the socket 330 at a low cost. Moreover, it is possible to simplify the fabrication process steps and to thus decrease the fabrication cost.

(Embodiment 12)

Next, a description of a twelfth embodiment of the present invention will be provided. A basic structure of the twelfth embodiment of the present invention is the same as that of the ninth embodiment described above. In order to distinguish the reference numbering system of the present embodiment from those of the ninth embodiment, and its alterations, the tenth and eleventh embodiments, a different reference numbering system is employed in the twelfth embodiment.

Figures 24A, 24B:
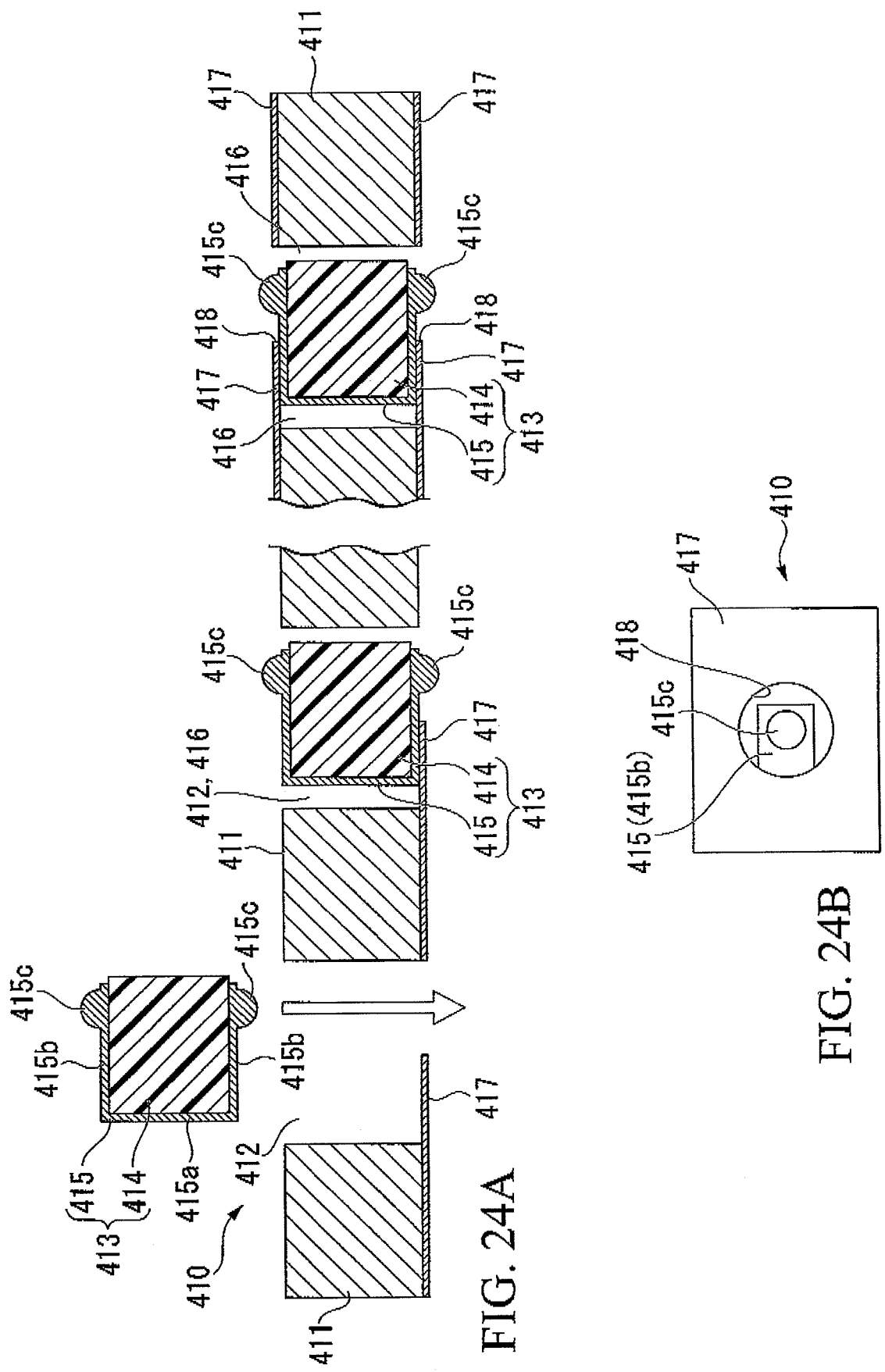
FIG. 24A is a side cross-sectional view of a socket according to a twelfth embodiment of the present invention.
FIG. 24B is a top plan view of a main part of the socket according to the twelfth embodiment.

FIGS. 24A and 24B are views illustrating a socket according to the twelfth embodiment of the present invention. FIG. 24A is a side cross-sectional view of the socket 410, and FIG. 24B is a top plan view of a main part thereof. In the drawings, reference numeral 410 designates a socket, 411 designates a housing, 412 designates a terminal insertion hole, 413 designates a contact terminal, 414 designates an elastomeric member, 415 designates a metal terminal, 415a designates a main columnar portion, 415b designates an arm portion, 415c designates a convex portion, 416 designates a gap, 417 designates a sheet, and 418 designates an opening.

The socket 410 according to the present embodiment includes a contact terminal 413 which includes a metal terminal 415 having an angular U shape having a main columnar portion 415a and arm portions 415b configured to extend from both ends of the main columnar portion 415a; and an elastomeric member 414 firmly held between the arm portions 415b on both sides; and a housing 411 having formed therein a terminal insertion hole 412 through which the contact terminal 413 is inserted, and is characterized in that the terminal insertion hole 412 has such a hole shape that it is able to firmly hold two side surfaces of the side surfaces of the elastomeric member 414 not being covered by the metal terminal 415 when the contact terminal 413 is inserted thereto, and that a gap 416 is formed between the inner wall of the hole and other side surfaces.

Moreover, in the present embodiment, a sheet 417 having formed therein openings 418 for exposing portions of the arm portions 415b is fixed on both a front surface and a back surface of the housing 411 so as to be in contact with the contact terminal 413 in a state where the contact terminal 413 is inserted into the terminal insertion hole 412. Furthermore, a convex portion 415c is provided on an outer surface of each of the arm portions 415b of the metal terminal 415 so as to be in contact with a terminal portion of a substrate or an IC package.

The metal terminal 415 having an angular U shape used in the socket 410 according to the present embodiment is preferably formed of materials having high conductive properties such as copper or brass, and it is preferable to apply gold plating to an outer surface thereof in order to decrease contact resistance.

Moreover, a material of the elastomeric member 414 is appropriately selected from a variety of types of elastomer materials capable of appropriately exhibiting an elastic repulsive force upon application of a load to the arm portions 415b, and a fluorinated elastomer is preferably used when heat-resisting properties are required. A height of the elastomeric member 414 firmly held in the metal terminal 415 having an angular U shape is preferably equal to an inside height dimension of the metal terminal 415.

The housing 411 used for the socket 410 according to the present embodiment may be formed of a synthetic resin or the like. The terminal insertion hole 412 formed in the housing 411 may be formed simultaneously with the forming of the housing 411. Alternatively, a housing with no hole formed therein may be formed first, and then terminal insertion holes 412 having a desired dimension may be formed, e.g., by drilling, at predetermined pitches by means of punching.

The sheet 417 used for the socket 410 according to the present embodiment may be formed of a resin sheet made of a polyimide resin. The opening 418 provided in the sheet 417 is preferably designed to have an opening size capable of exposing a portion of the arm portion 415b of the metal terminal 415, particularly, the convex portion 415c and the periphery thereof.

The socket 410 according to the present embodiment has a contact terminal structure in which the metal terminal 415 having an angular U shape is used as the contact terminal 413 and in which a repulsive force thereof is secured by the elastomeric member 414 firmly held by the metal terminal 415, so that desired load-displacement characteristics are obtained by the repulsive force of the elastomer. The present invention is characterized in that a fixing structure for allowing a single body of the contact terminal to be used as a socket is employed.

A description of the fixing structure will be provided below.

In the conventional socket having a plate spring structure as disclosed in Patent Documents 1 and 2, for example, metal terminals having a plate spring function are press-fitted into a housing formed of an insulating resin. Moreover, a beam part for the press-fit is provided in the terminal, and the beam part is designed to a dimension slightly larger than an insertion portion of the housing, so that a predetermined holding force can be secured.

On the other hand, in the socket 410 according to the present embodiment, since the elastomeric member 414 is used to provide the contact terminal 413 with a repulsive force, the optimum press-fit condition differs from the case of inserting the metal terminal 415 into the resin-made housing 411. In the case of using the elastomeric member 414, the relationship between a load applied to the metal terminal 415 and a stroke thereof relate to a frictional force generated between the elastomeric member 414 and a substance present in the periphery thereof. When the frictional force is large, it becomes difficult to operate at a low load, and the movement is likely to differ with a change in the load between when a load is increased and when a load is decreased.

For this reason, in the present embodiment, the terminal insertion hole 412 of the housing 411 is designed to have such a hole shape that a dimension thereof on a side extending in the extending direction of the arm portion 415b is larger than that of the contact terminal 413 while a dimension thereof on a side extending vertical to the extending direction is slightly smaller than that of the contact terminal 413. Owing to such a configuration, when the terminal is inserted into the terminal insertion hole 412, the elastomeric member 414 is compressed, and thus, a predetermined holding force can be secured. For example, when the terminal insertion hole 412 is formed, e.g., by means of molding or laser machining, in the housing 411 by using materials such as polyimide plate, a dimension thereof in a fixing direction where a portion of the contact terminal 413 is firmly held is designed to be slightly smaller than that of the contact terminal 413. Moreover, a direction where the contact terminal 413 is not fixed is provided in the terminal insertion hole 412, and a dimension thereof in the direction where the contact terminal 413 is not fixed is designed to be larger than that of the contact terminal 413 so that the contact terminal 413 does not make contact with the housing 411. When the contact terminal 413 is press-fitted into the thus-processed terminal insertion hole 412, the contact terminal 413 is fixed into the terminal insertion hole 412 by the elastic repulsive force of the press-fitted elastomeric member 414.

When a load is applied to the contact terminal 413, the elastomeric member 414 within the contact terminal 413 can be easily deformed since it deforms toward the gap 416 which is not in contact with the housing 411. On the other hand, in a structure where there is no gap between the contact terminal 413 and the housing 411, the elastomeric member 414 is unable to deform and thus would not be deformed unless a large load is applied thereto, which is not desirable as a characteristic of the socket 410.

(Embodiment 13)

Figure 25A:
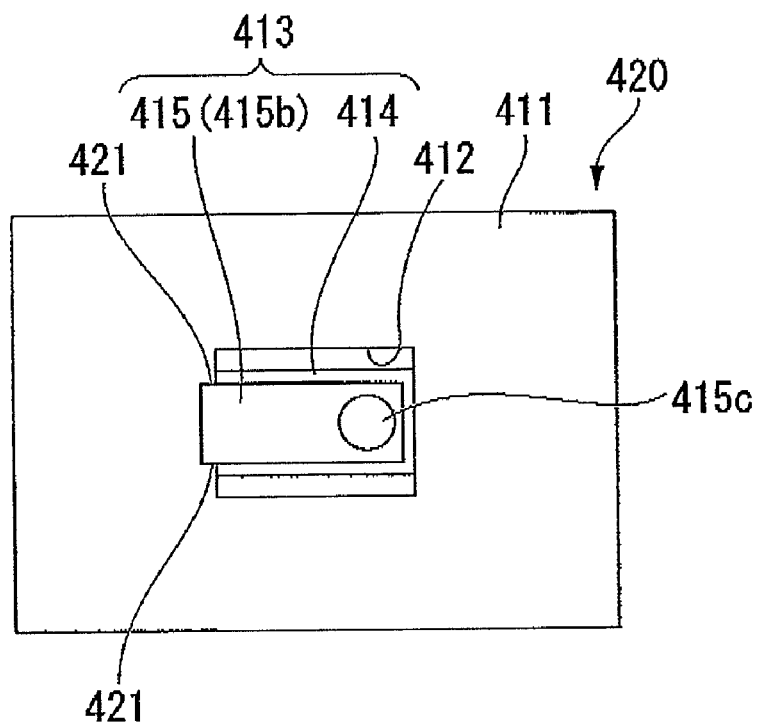
FIG. 25A is a top plan view of a socket according to a thirteenth embodiment of the present invention.
Figure 25B:
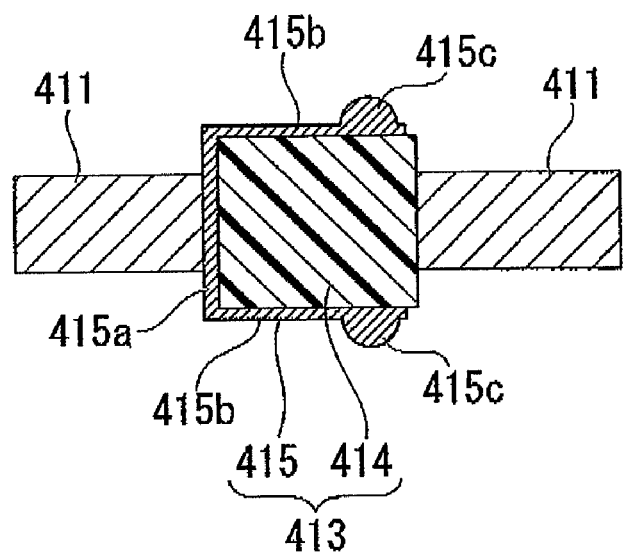
FIG. 25B is a side cross-sectional view thereof.

FIGS. 25A and 25B are views illustrating a socket according to a thirteenth embodiment of the present invention. FIG. 25A is a top plan view of the socket 420, and FIG. 25B is a side cross-sectional view thereof.

The socket 420 according to the present embodiment has substantially the same components as those of the socket 410 according to the twelfth embodiment described above, except that the hole shape of the terminal insertion hole 412 formed in the housing 411 is modified, and the same components are denoted by the same reference numerals.

The socket 420 according to the present embodiment is characterized in that the terminal insertion hole 412 formed in the housing 411 is designed to have a convex shape as viewed in a plan view. Moreover, a vertex portion of the convex shape is configured as an engagement portion 421 to which the main columnar portion 415a of the contact terminal 413 is fitted. The distance between the engagement portion 421 and an opposing surface of the terminal insertion hole 412 is designed to be slightly smaller than the length of the contact terminal 413. Therefore, when the contact terminal 413 having the main columnar portion 415a being engaged with the engagement portion 421 is inserted into the terminal insertion hole 412, the elastomeric member 414 is compressed, and thus, the main columnar portion 415a is pressed against the engagement portion 421. As a result, it becomes difficult for the contact terminal 413 to be removed from the terminal insertion hole 412. Furthermore, a gap is formed between the other side surface of the contact terminal 413 and the inner wall of the terminal insertion hole 412 of the housing 411.

According to the socket 420 of the present embodiment, the terminal insertion hole 412 of the housing 411 has a convex shape, and a distal end portion of the convex shape is configured as the engagement portion 421 having a dimension slightly smaller than the metal terminal 415, so that the main columnar portion 415a of the metal terminal 415 is fitted into the engagement portion 421. Therefore, a constant force acts in both a terminal fixing direction and a vertical direction, and thus, it is possible to more certainly prevent the removal of the contact terminal 413. Moreover, since the position of the metal terminal 415 can be determined by the engagement portion 421, it is possible to provide the advantage of reducing misalignment of the metal terminal 415 during fabrication.

(Embodiment 14)

Figure 26A:
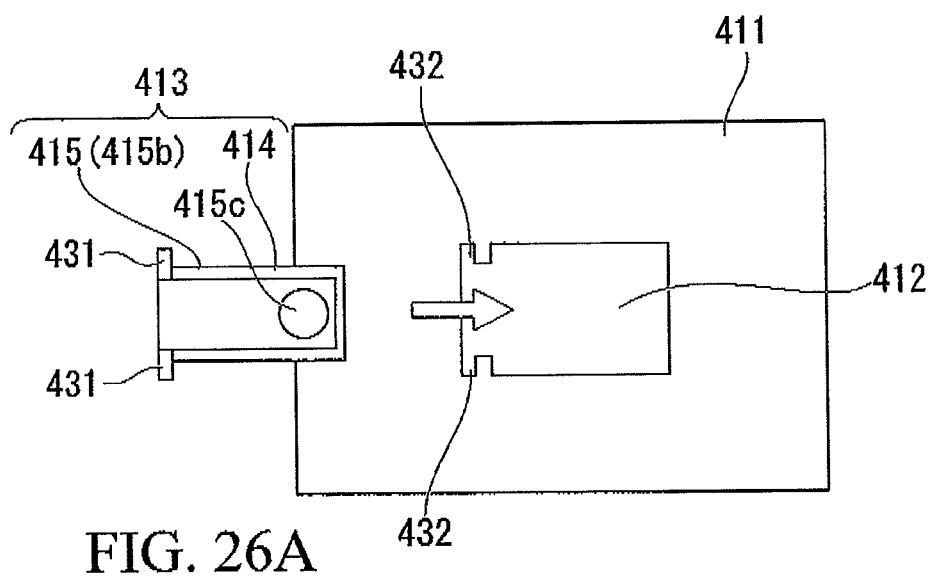
FIG. 26A is a top plan view of a socket according to a third embodiment of the present invention, illustrating a state where a contact terminal is inserted into a terminal insertion hole of a housing thereof.
Figure 26B:
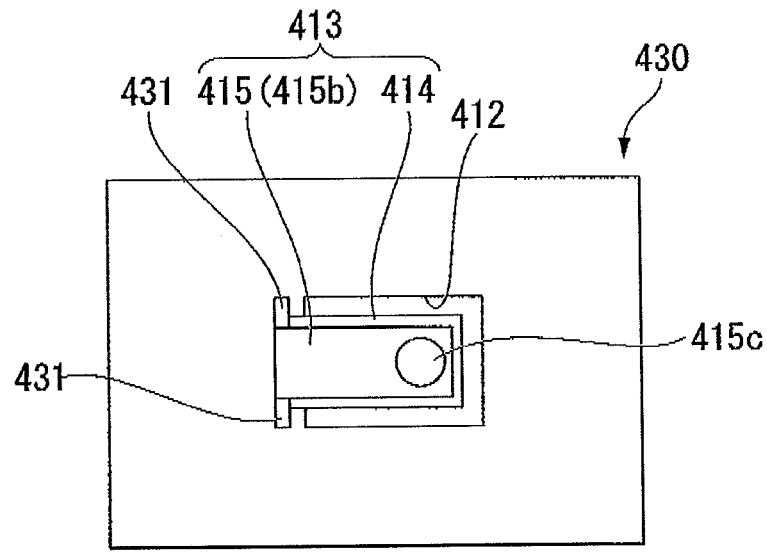
FIG. 26B is a top plan view of the socket.
Figure 26C:
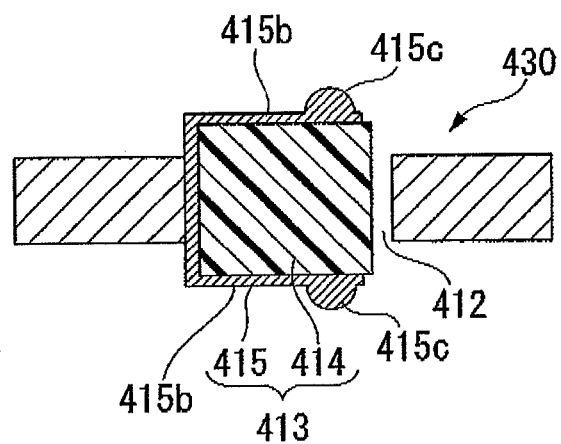
FIG. 26C is a side cross-sectional view of the socket.

FIGS. 26A to 26C are views illustrating a socket according to a fourteenth embodiment of the present invention. FIG. 26A is a top plan view illustrating the state where the contact terminal 413 is inserted into the terminal insertion hole 412 of the housing 411, FIG. 26B is a top plan view of the socket 430, and FIG. 26C is a side cross-sectional view of the socket 430.

The socket 430 according to the present embodiment includes a contact terminal 413 configured by using a metal terminal 415 having formed therein a beam part 431 protruding outwardly and a housing 411 having formed therein a terminal insertion hole 412 having an engagement portion 432 to which the beam part 431 is fitted.

In the socket 430 according to the present embodiment, the contact terminal 413 is firmly fitted into the terminal insertion hole 412 of the housing 411 while the beam part 431 being fitted into the engagement portion 432 is prevented from being removed therefrom in a state where the contact terminal 413 is fitted into the terminal insertion hole 412. In this manner, by making the beam part 431 of the contact terminal 413 to be engaged with the housing 411, it is possible to maintain the load-displacement characteristics of a single body of the contact terminal 413 while preventing a portion of the contact terminal 413 corresponding to the elastomeric member 414 from making contact with the housing 411.

(Embodiment 15)

Figure 27:
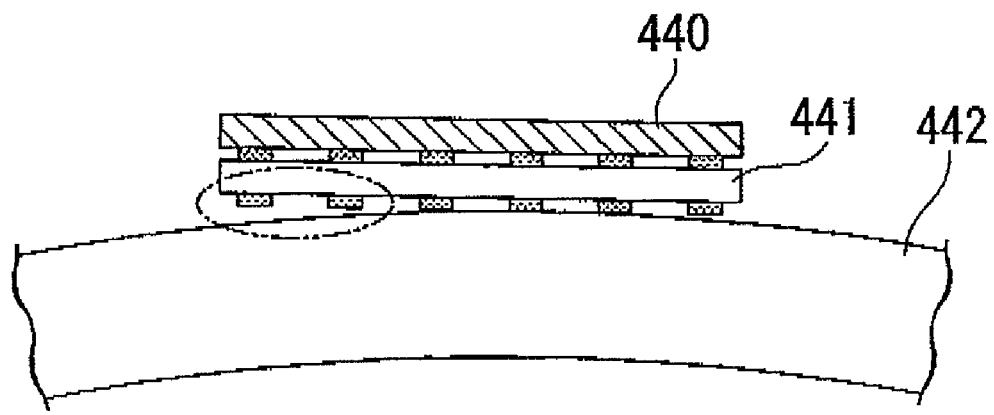
FIG. 27 is a side view of a semiconductor device configured by a nonflexible socket according to a reference example.
Figure 28:
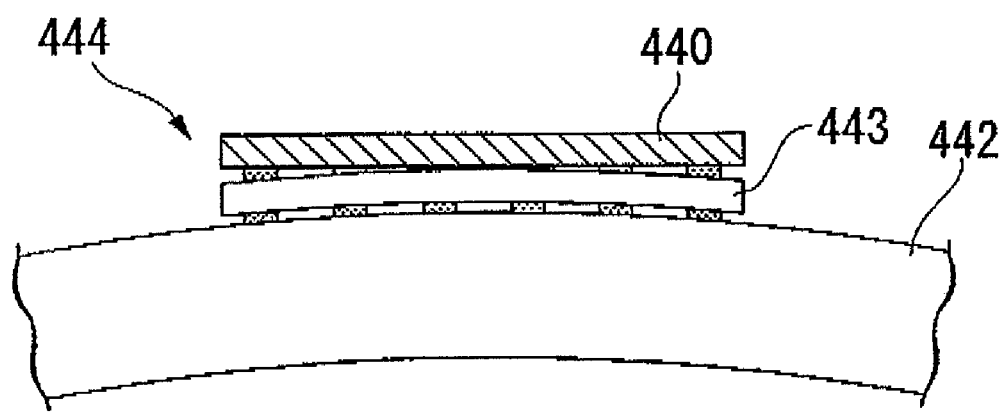
FIG. 28 is a side view of a socket according to a fifteenth embodiment of the present invention and a semiconductor device configured by the socket.

FIG. 28 is a view illustrating a socket according to a fifteenth embodiment of the present invention and an example of a semiconductor device configured by using the socket. FIG. 27 is a view of a non-flexible socket according to a reference example. In the drawings, reference numeral 440 designates an IC package such as an LGA package, 441 designates a non-flexible socket according to the reference example, 442 designates a warped substrate, 443 designates a flexible socket according to the present embodiment, and 444 designates a semiconductor device configured by using the socket 443.

The socket 443 according to the present embodiment has the same basic structure as either one of the sockets 410, 420, and 430 according to the twelfth and thirteenth embodiments described above, and is characterized in that a housing formed of an elastomer having flexibility is used, and the overall body of the socket 443 has some degree of flexibility and is thus able to cope with a warped substrate 442.

When the substrate 442 has some degree of warpage and when a semiconductor device is fabricated using a non-flexible socket 441, as illustrated in FIG. 27 as a broken line portion, a gap is likely to be formed in a bonding surface of the substrate 442 and the socket 441, which may lead to connection failure between the substrate 442 and the socket 441.

On the other hand, in the socket 443 according to the present embodiment, since a soft material having flexibility such as an elastomer material is used as a material of the housing, the elastomer assumes the warped shape of the substrate 442 when the socket 443 is mounted on the substrate 442, and it is thus possible to prevent mounting failure. Although in this case, the socket 443 or the substrate 442 is also warped, it does not matter because the height difference caused by the warpage can be absorbed by the stroke of the contact terminals when being contacted with an IC package.

(Embodiment 16)

Figure 29A:
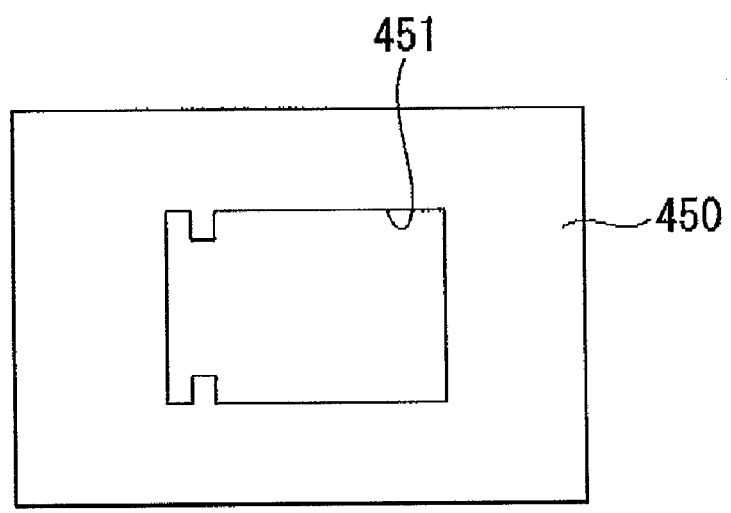
FIG. 29A is a top plan view of a socket according to a sixteenth embodiment of the present invention and a housing thereof having a terminal insertion hole formed therein.
Figure 29B:
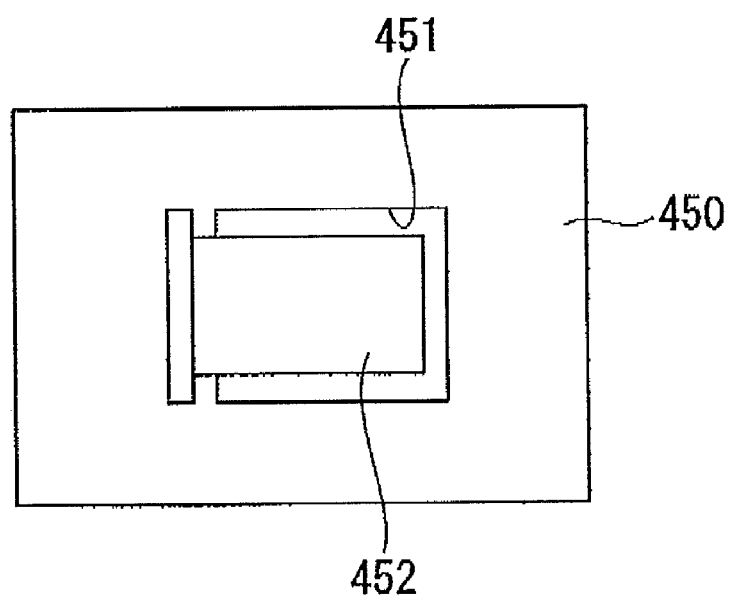
FIG. 29B is a top plan view illustrating a state where an elastomer for contact terminals is produced from an elastomer piece which has been cut away at the time of forming the terminal insertion hole.

FIGS. 29A and 29B are views illustrating a socket according to a sixteenth embodiment of the present invention. FIG. 29A is a top plan view of a housing 450 having formed therein a terminal insertion hole 451, and FIG. 29B is a top plan view illustrating the state where an elastomer 452 for contact terminals is produced from an elastomer piece which has been cut away at the time of forming the terminal insertion hole 451.

The socket according to the present embodiment has the same basic structure as that of the fourteenth embodiment described above, and uses an elastomer as a material of the housing 450, similar to the fifteenth embodiment. The socket according to the present embodiment is characterized in that an elastomer piece which has been cut away when the terminal insertion hole 451 is opened in the housing 450 is used as the elastomer 452 for contact terminals. Owing to such a structure, it is possible to save material costs, and since the elastomer 452 for terminals can be processed simultaneously with the punching processing, it is possible to decrease the number of processing steps and production costs.

Industrial Applicability

The present invention can be applied to an IC socket contact terminal used for mounting an, IC package such as a CPU or an LSI on a printed circuit board.

The invention claimed is:

1. A socket contact terminal for electrical connection between a connection portion formed of a metal conductor on a printed circuit board and a connection terminal of an IC package, the socket contact comprising:
   a metal terminal having an angular U shape including a main columnar portion and arm portions on both sides thereof; and
   an elastomeric member attached to the metal terminal,
   wherein a metal surface is exposed from an outer surface of each of the arm portions of the metal terminal,
   wherein the elastomeric member is firmly held between the arm portions of the metal terminal so as to exhibit a repulsive force when the arm portions are pressed in the direction that the arm portions approach each other,
   wherein the central portion of the main columnar portion of the metal terminal is formed to have a larger width than the other portions of the main columnar portion, in a direction perpendicular to the extending direction of the main columnar portion, and wherein at least a portion of the main columnar portion of the metal terminal is folded back on itself to have a larger thickness than the other portions of the main columnar portion.

2. The socket contact terminal according to claim 1, wherein the IC package is an LGA package or a BGA package.

3. The socket contact terminal according to claim 1, wherein a convex portion is provided on an outer surface side of the arm portions of the metal terminal.

4. The socket contact terminal according to claim 1, wherein the metal terminal is obtained by applying gold plating to a surface of a substrate formed of copper or copper alloy.

5. The socket contact terminal according to claim 1, wherein at least a portion of the main columnar portion of the metal terminal is formed to have a larger thickness than other portions.

6. The socket contact terminal according to claim 3, wherein the convex portion has a dome shape.

7. The socket contact terminal according to claim 3, wherein the convex portion has a semi-cylindrical shape.

8. The socket contact terminal according to claim 1, wherein the elastomeric member is a fluorine rubber.

9. A semiconductor device comprising the socket contact terminal according to any one of claims 1-4 and 5-8, a printed circuit board, and an IC package, the printed circuit board and the IC package being electrically connected with each other through the intervention of the socket contact terminal.

10. A socket, comprising:
   an elastomer having a groove or a through-hole formed in a peripheral portion of a metal terminal arrangement region and a terminal attachment through-hole formed in a portion of a peripheral border of the metal terminal arrangement region; and
   a metal terminal having an angular U shape, including a main columnar portion being in contact with an inner surface of the terminal attachment through-hole and arm portions configured to extend from both ends of the main columnar portion along both front and back surfaces of the elastomer to the metal terminal arrangement region,
   wherein the central portion of the main columnar portion of the metal terminal is formed to have a larger width than the other portions of the main columnar portion, in a direction perpendicular to the extending direction of the main columnar portion, and wherein at least a portion of the main columnar portion of the metal terminal is folded back on itself to have a larger thickness than the other portions of the main columnar portion.

11. The socket according to claim 10, herein the elastomer is a fluorinated elastomer.

12. The socket according to claim 10, wherein the elastomer has a groove formed in a peripheral portion of the metal terminal arrangement region on either one of the front and back surface thereof, the groove having a depth that does not penetrate through the elastomer.

13. The socket according to claim 10, wherein the elastomer has a through-hole formed in a peripheral portion of the metal terminal arrangement region so as to penetrate through the front and back surfaces thereof.

14. The socket according to claim 10, wherein a convex portion is provided on an outer surface of the arm portions of the metal terminal.

15. The socket according to claim 10, wherein the plurality of the metal terminals is provided in a plate-like elastomer.

16. A method of fabricating the socket according to claim 10, the method comprising the steps of:
   boring a terminal attachment through-hole in a portion of a peripheral border of a metal terminal forming position;
   preparing an elastomer having a groove or a through-hole formed in a peripheral portion of the metal terminal forming position and a metal terminal having an angular U shape comprising a main columnar portion and arm portions on both sides thereof, the central portion of the main columnar portion of the metal terminal being formed to have a larger width than the other portions of the main columnar portion, in a direction perpendicular to the extending direction of the main columnar portion;
   passing a portion of the metal terminal into the terminal attachment through-hole of the elastomer; and
   making the elastomer at the metal terminal forming position to be firmly held between arm portions on both sides of the metal terminal, thereby obtaining the socket.

17. A method of fabricating the socket according to claim 10, the method comprising the steps of:
   boring a terminal attachment through-hole in a portion of a peripheral border of a metal terminal forming position;
   preparing an elastomer having a groove or a through-hole formed in a peripheral portion of the metal terminal forming position and a metallic member having a generally L shape or a straight-line shape, at least a portion of the metallic member being formed to have a larger width than the other portion;

fitting the metallic member into the terminal attachment through-hole of the elastomer;

folding the metallic member at one end side or both end sides thereof to form a metal terminal having an angular U shape; and making the elastomer at the metal terminal forming position to be firmly held between arm portions on both sides of the metal terminal, thereby obtaining the socket.

18. The socket fabrication method according to claim 16, wherein the elastomer is a fluorinated elastomer.

19. The socket fabrication method according to claim 16, wherein the elastomer has a groove formed in a peripheral portion of the metal terminal arrangement region on either one of the front and back surface thereof, the groove having a depth that does not penetrate through the elastomer.

20. The socket fabrication method according to claim 16, wherein the elastomer has a through-hole formed in a peripheral portion of the metal terminal arrangement region so as to penetrate through the front and back surfaces thereof.

21. The socket fabrication methods according to claim 16, wherein a convex portion is provided on an outer surface of the arm portions of the metal terminal.

22. The socket fabrication method according to claim 16, wherein a plurality of the metal terminals is provided in a plat-like elastomer.

23. A semiconductor device comprising the socket according to claim 10, a printed circuit board, and an IC package, the printed circuit board and the IC package being electrically connected with each other through the intervention of the socket.

24. A socket, comprising:
an plate-like elastomeric member having a slit having an angular U shape or a generally U shape formed in a peripheral border of a metal terminal arrangement region and a tongue piece portion serving as the metal terminal arrangement region formed at an inner side of the slit; and a metal terminal having an angular U shape including a main columnar portion and arm portions configured to extend from both ends of the main columnar portion with the tongue piece portion being firmly held between the arm portions, wherein the main columnar portion of the metal terminal is formed at a protrusive distal end portion of the tongue piece portion and a terminal contact portion among the arm portions is arranged in the vicinity of a proximal end portion of the tongue piece portion, and wherein the central portion of the main columnar portion of the metal terminal is formed to have a larger width than the other portions of the main columnar portion, in a direction perpendicular to the extending direction of the main columnar portion, and wherein at least a portion of the main columnar portion of the metal terminal is folded back on itself to have a larger thickness than the other portions of the main columnar portion.

25. The socket according to claim 24, wherein the elastomeric member is a fluorinated elastomer.

26. The socket according to claim 24, wherein a convex portion is provided on an outer surface of the arm portions of the metal terminal.

27. The socket according to claim 24, wherein the metal terminal and the tongue piece portion have a structure in which they make a three-or more point contact, a surface contact, or a straight-line contact on one surface with each other.

28. The socket according to claim 24, wherein a plurality of the metal terminals is provided in the elastomeric member.

29. The socket according to claim 24, wherein one of the arm portions of the metal terminal is used as a soldering land and the other arm portion is used as a connection terminal of an IC package.

30. A method of fabricating the socket according to claim 24, the method comprising the steps of:
preparing an plate-like elastomeric member having a slit having an angular U shape or a generally U shape formed in a peripheral border of a metal terminal arrangement region and a tongue piece portion serving as the metal terminal arrangement region formed at an inner side of the slit and a metal terminal having an angular U shape comprising a main columnar portion and arm portions on both sides thereof, the central portion of the main columnar portion of the metal terminal being formed to have a larger width than the other portions of the main columnar portion, in a direction perpendicular to the extending direction of the main columnar portion;

upwardly pressing or downwardly pulling the tongue piece portion of the elastomeric member so as to be projected from a front surface or a back surface of the elastomeric member and leaving it in this state;

attaching the metal terminal to the tongue piece portion projected from the front surface or the back surface of the elastomeric member so that the tongue piece portion is firmly held between arm portions of the metal terminal; and making the tongue piece portion having the metal terminal attached thereto to be received in the slit, thereby obtaining the socket.

31. A method of fabricating the socket according to claim 24, the method comprising the steps of:
preparing an plate-like elastomeric member having a slit having an angular U shape or a generally U shape formed in a peripheral border of a metal terminal arrangement region and a tongue piece portion serving as the metal terminal arrangement region formed at an inner side of the slit and a metallic member having a generally L shape or a straight-line shape, at least a portion of the metallic member being formed to have a larger width than the other portion;

fitting the metallic member into the elastomeric member through the slit; and folding the metallic member at one end side or both end sides thereof to form a metal terminal having an angular U shape and making the tongue piece portion to be firmly held between arm portions on both sides of the metal terminal, thereby obtaining the socket.

32. The socket fabrication according to claim 30, wherein the elastometric member is a fluorinated elastomer.

33. The socket fabrication method according to claim 30, wherein a convex portion is provided on an outer surface of the arm portions of the metal terminal.

34. The socket fabrication method according to claim 30, wherein the metal terminal and the tongue piece portion have a structure in which they make a three-or more point contact, a surface contact, or a straight-line contact on one surface with each other.

35. The socket fabrication method according to claim 30, wherein a plurality of the metal terminals is provided in the elastomeric member.

36. The socket fabrication method according to claim 30, wherein one of the arm portions of the metal terminal is used as a soldering land and the other arm portion is used as a connection terminal of an IC package.

37. A semiconductor device comprising the socket according to claim 24, a printed circuit board, and an IC package, the printed circuit board and the IC package being electrically connected with each other through the intervention of the socket.

38. A socket, comprising:
a contact terminal, including:
a metal terminal having an angular U shape having a main columnar portion and arm portions configured to extend from both ends of the main columnar portion; and
an elastomeric member firmly held between the arm portions on both sides; and
a housing having formed therein a terminal insertion hole through which the contact terminal is inserted,
wherein the central portion of the main columnar portion of the metal terminal is formed to have a larger width than the other portions of the main columnar portion, in a direction perpendicular to the extending direction of the main columnar portion, wherein at least a portion of the main columnar portion of the metal terminal is folded back on itself to have a larger thickness than the other portions of the main columnar portion;
wherein the terminal insertion hole has a hole dimension larger than the contact terminal, and
wherein a sheet having formed therein openings for exposing portions of the arm portions is fixed on at least one of a front surface and a back surface of the housing so as to be in contact with the contact terminal in a state where the contact terminal is inserted into the terminal insertion hole.

39. The socket according to claim 38, wherein the sheet is formed of an insulating material.

40. The socket according to claim 38, wherein the sheet is formed of a metal, and the sheet has an independent structure for each contact terminal.

41. The socket according to claim 38, wherein the sheet is provided on either one of the front surface or the back surface of the housing, and a bonding layer is provided on a portion of the sheet being in contact with the contact terminal.

42. The socket according to claim 38, wherein the terminal insertion hole is designed to have such a hole dimension that a gap is formed in at least a portion of a region between the elastomeric member and an inner wall of the terminal insertion hole upon application of a load to the contact terminal.

43. The socket according to claim 38, wherein a convex portion is provided on an outer surface of the arm portions.

44. A semiconductor device comprising the socket according to claim 38, a substrate, and an IC package, the substrate and the IC package being electrically connected with each other through the intervention of the socket.

45. A socket, comprising:
a contact terminal, including:
a metal terminal having an angular U shape having a main columnar portion and arm portions configured to extend from both ends of the main columnar portion; and
an elastomeric member firmly held between the arm portions on both sides; and
a housing having formed therein a terminal insertion hole through which the contact terminal is inserted,
wherein the central portion of the main columnar portion of the metal terminal is formed to have a larger width than the other portions of the main columnar portion, in a direction perpendicular to the extending direction of the main columnar portion, wherein at least a portion of the main columnar portion of the metal terminal is folded back on itself to have a larger thickness than the other portions of the main columnar portion, and
wherein the terminal insertion hole has such a hole shape that it is able to firmly hold or engage with at least a portion of the contact terminal when the contact terminal is inserted thereto.

46. The socket according to claim 45, wherein the terminal insertion hole is designed to have a convex shape having an engagement portion to which the metal terminal of the contact terminal is press-fitted.

47. The socket according to claim 45, wherein the terminal insertion hole is designed to have such a hole dimension that a gap is formed in at least a portion of a region between an inner wall of the terminal insertion hole and the contact terminal in a state where the contact terminal is inserted thereto.

48. The socket according to claim 45, wherein the housing is formed of an elastomeric member.

49. The socket according to claim 48, wherein the housing is formed of the same elastomeric member as the elastomeric member used for the contact terminal.

50. The socket according to claim 45, wherein a convex portion is provided on an outer surface of the arm portions.

51. A semiconductor device comprising the socket accordingly to claim 45, a substrate, and an IC package, the substrate and the IC package being electrically connected with each other through the intervention of the socket.

* * * * *